(12) United States Patent
Dutta

(10) Patent No.: US 10,644,174 B2
(45) Date of Patent: May 5, 2020

(54) HIGH EFFICIENCY PHOTOVOLTAIC CELLS WITH SELF CONCENTRATING EFFECT

(71) Applicant: Achyut Kumar Dutta, Sunnyvale, CA (US)

(72) Inventor: Achyut Kumar Dutta, Sunnyvale, CA (US)

(73) Assignee: Banpil Photonics, Inc., Santa Clara, CA (US)

(*) Notice: Subject to any disclaimer, the term of this patent is extended or adjusted under 35 U.S.C. 154(b) by 11 days.

(21) Appl. No.: 15/474,232

(22) Filed: Mar. 30, 2017

(65) Prior Publication Data

US 2017/0236953 A1    Aug. 17, 2017

Related U.S. Application Data

(60) Continuation-in-part of application No. 14/217,227, filed on Mar. 17, 2014, now Pat. No. 10,014,421,
(Continued)

(51) Int. Cl.
| | |
|---|---|
| *H01L 31/0236* | (2006.01) |
| *H01L 31/054* | (2014.01) |
| *H01L 31/0216* | (2014.01) |
| *H01L 31/0352* | (2006.01) |
| *H01L 31/0296* | (2006.01) |

(52) U.S. Cl.
CPC .... *H01L 31/02363* (2013.01); *H01L 31/0236* (2013.01); *H01L 31/0296* (2013.01); *H01L 31/02168* (2013.01); *H01L 31/0352* (2013.01); *H01L 31/03529* (2013.01);
(Continued)

(58) Field of Classification Search
CPC ............ H01L 31/0296; H01L 31/0304; H01L 31/035281; H01L 31/07; H01L 31/072; H01L 31/073; H01L 31/0735; H01L 31/18; H01L 31/1804; H01L 31/1828; H01L 31/184
See application file for complete search history.

(56) References Cited

U.S. PATENT DOCUMENTS 5,100,478 A * 3/1992 Kawabata ............ H01L 31/061
136/249
5,101,260 A * 3/1992 Nath .................... H01L 31/0236
136/249
(Continued)

*Primary Examiner* — Golam Mowla

(57) ABSTRACT

This invention relates to a novel structure of photovoltaic devices (e.g. photovoltaic cells also called as solar cells) are provided. The cells are based on the micro or nano scaled structures which could not only increase the surface area but also have the capability of self-concentrating the light incident onto the photonics devices. More specifically, the structures are based on 3D structure including quintic or quintic-like shaped micor-nanostructures. By using such structures reflection loss of the light from the cell is significantly reduced, increasing the absorption, which results in increasing the conversion efficiency of the solar cell, and reducing the usage of material while increasing the flexibility of the solar cell. The structures can be also used in other optical devices wherein the reflection loss and absorption are required to enhanced to significantly improve the device performances.

19 Claims, 23 Drawing Sheets

Related U.S. Application Data which is a division of application No. 11/859,742, filed on Sep. 22, 2007, now Pat. No. 8,716,594.

(60) Provisional application No. 60/827,015, filed on Sep. 26, 2006.

(52) U.S. Cl.
CPC .. H01L 31/035281 (2013.01); H01L 31/0547 (2014.12); *Y02E 10/52* (2013.01)

(56) References Cited

U.S. PATENT DOCUMENTS

| | | | |
|---|---|---|---|
| 5,110,370 A * | 5/1992 | Vogeli | H01L 31/048 136/244 |
| 5,421,909 A * | 6/1995 | Ishikawa | H01L 31/02167 136/256 |
| 2007/0204902 A1* | 9/2007 | Dutta | H01L 31/035281 136/256 |
| 2011/0120554 A1* | 5/2011 | Chhajed | C09D 1/00 136/259 |
| 2013/0109128 A1* | 5/2013 | Katsura | H01L 31/02363 438/71 |

* cited by examiner

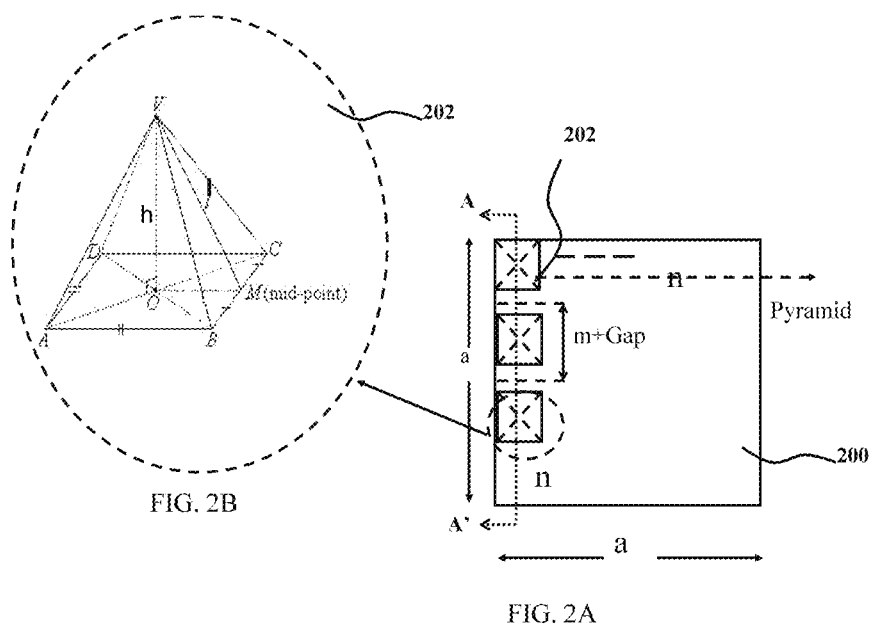
FIG. 2B
FIG. 2A
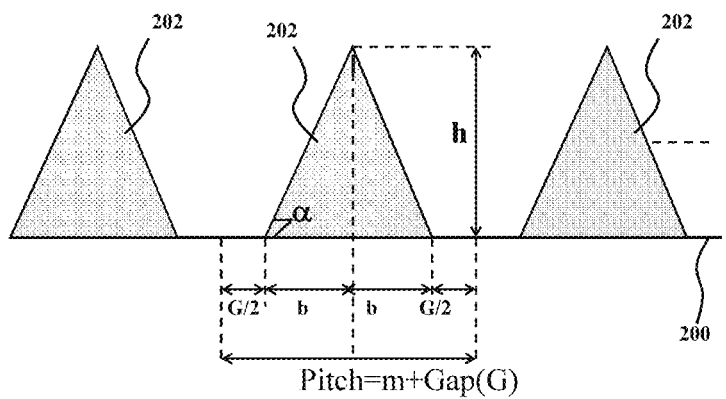
Gap between two pyramid= G , height=h, angle=α
Base of the pyramid= 2b=m
Maximum base ($b_{max}$) =G/2+b
Minimum base ($b_{min}$) ~0
FIG. 2C Minimum angle=a' for fixed $h$
Maximum base ($b_{max}$) =G/2+b and min. angle=a'
Minimum base ($b_{min}$) ~0 and max. angle ~90°

For tilted side of angle a,

Light transmitted to tilted side for a light component having Intensity $I$ is $I(\cos a)$, and reflected light $(R) = I(1-\cos a)$, When a' is minimum and maximum transmission is possible

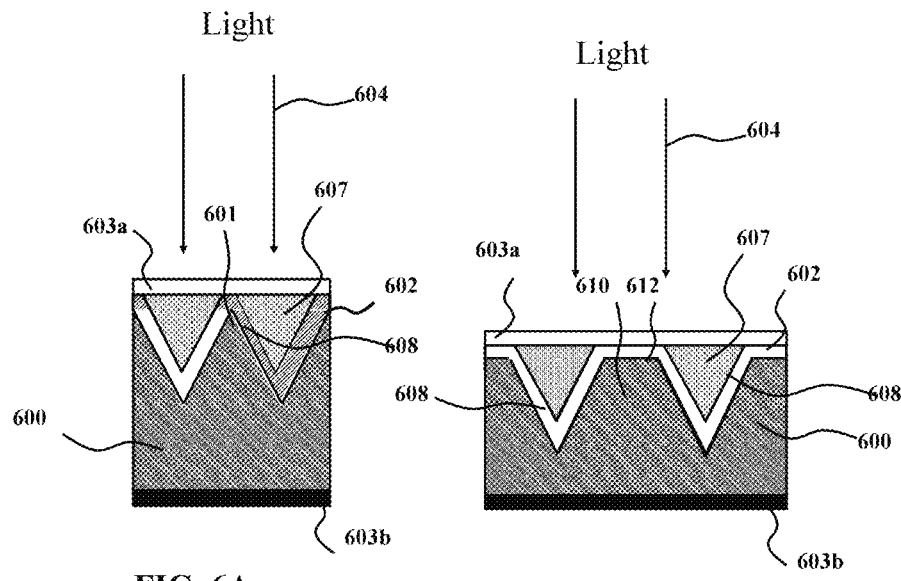
FIG. 6A
FIG. 6B
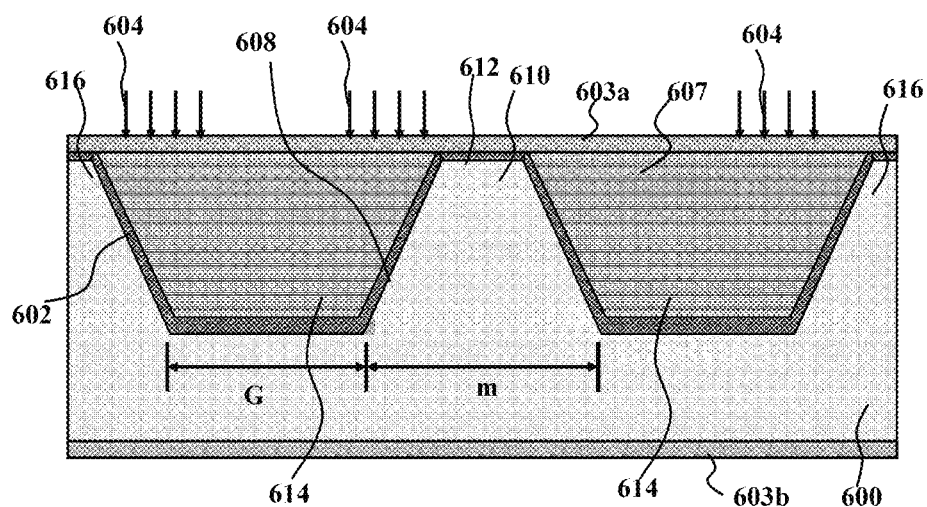
FIG. 6C

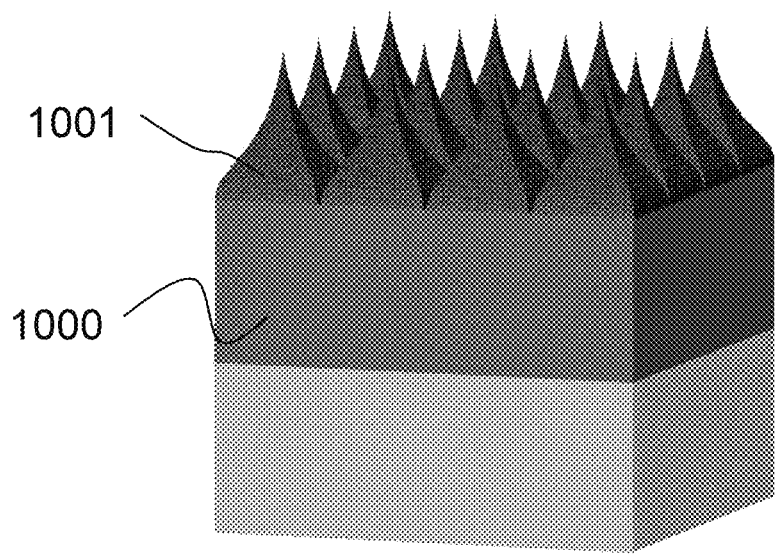
FIG.10A
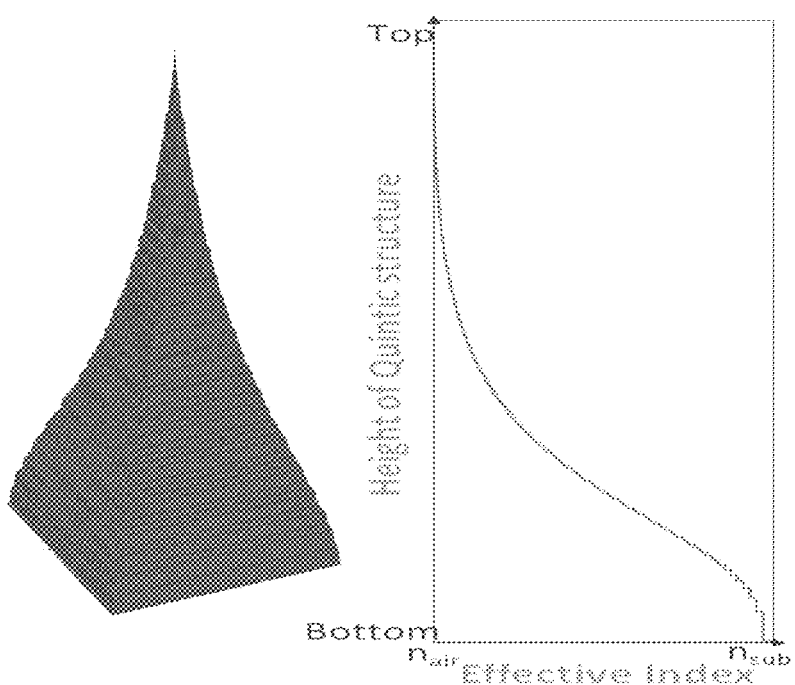
FIG. 10 B
FIG. 10 C

HIGH EFFICIENCY PHOTOVOLTAIC CELLS WITH SELF CONCENTRATING EFFECT

CROSS REFERENCE TO RELATED APPLICATIONS

This application is a continuation-in-part of U.S. patent application Ser. No. 14/217,227 filed on Mar. 17, 2014, which is a divisional of,
(a) U.S. patent application Ser. No. 11/859,742, filed on Sep. 22, 2007, now U.S. Pat. No. 8,716,594, which claims,
(b) the benefit and priority of U.S. Provisional Application No. 60/827,015 filed Sep. 26, 2006.

STATEMENT REGARDING FEDERALLY SPONSORED RESEARCH AND DEVELOPMENT

New matter invention included as the continuity-in-part patent application was made with United States Government support under W91CRB11C0097 awarded by US Army Contracting Command. As such, the United States Government has certain rights in this invention.

FIELD OF INVENTIONS

This patent specification relates to structures of photovoltaic cells (hereafter mentioned as also "solar cells"). More specifically, it relates to photovoltaic cells comprising with structures for increasing the junction area and also for absorbing broad solar spectral for increasing power generation capability per unit area. This also relates with the photovoltaic cells having elf amplifying capabilities concentrating (increasing) light intensity incident on its surface. This also relates to photovoltaic cells comprising with nano-scaled blocks. These photovoltaic cells can be used in commercial, residential, and also industrial application for power generation.

BACKGROUND OF THE INVENTIONS

Photovoltaic cells where light is converted into electric power have been prevailing in a wide range of application fields such as consumer electronics, industrial electronics, and space exploration. In consumer electronics, photovoltaic cells that consist of materials such as amorphous silicon are choices for a variety of inexpensive and low power applications. Typical conversion efficiency, i.e. the solar cell conversion efficiency, of amorphous silicon based photovoltaic cells ranges between ~10% [Yamamoto K, Yoshimi M, Suzuki T, Tawada Y, Okamoto T, Nakajima A. Thin film poly-Si solar cell on glass substrate fabricated at low temperature. Presented at MRS Spring Meeting, San Francisco, April 1998.]. Although the fabrication processes of amorphous silicon based photovoltaic cells are rather simple and inexpensive, one notable downside of this type of cell is its vulnerability to defect-induced degradation that decreases its conversion efficiency.

In contrast, for more demanding applications such as residential and industrial solar power generation systems, either poly-crystalline or single-crystalline silicon is the choice because of more stringent requirements for better reliability and higher efficiency than the applications in consumer electronics. Photovoltaic cells consisting of poly-crystalline and single-crystalline silicon generally offer the conversion efficiency ranging ~20% and ~25% [Zhao J, Wang A, Green M, Ferrazza F. Novel 19.8% efficient 'honeycomb' textured multicrystalline and 24.4% monocrystalline silicon solar cell. Applied Physics Letters 1998; 73: 1991-1993.] respectively. As many concerns associated with a steep increase in the amount of the worldwide energy consumption are raised, further development in industrial solar power generation systems has been recognized as a main focus. However, due to high cost ($3 to $5/Watt) of today's Si-based solar cell, this Si-solar cell is not yet widely accepted as an alternative source for the energy solution.

Group II-VI compound semiconductors, for example CdTe and CdS, have been investigated in the context of having industrial solar power generation systems manufactured at a lower cost with maintaining a moderate conversion efficiency, resulted in a comparable conversion efficiency ~17% [Wu X, Keane J C, Dhere R G, DeHart C, Duda A, Gessert T A, Asher S, Levi D H, Sheldon P. 16.5%-efficient CdS/CdTe polycrystalline thin-film solar cell. Proceedings of the 17th European Photovoltaic Solar Energy Conference, Munich, 22-26 Oct. 2001; 995-1000.] to those for the single crystalline silicon photovoltaic devises, however toxic natures of these materials are of great concerns for environment.

Group I-III-VI compound semiconductors, such as CuInGaSe2, have been also extensively investigated for industrial solar power generation systems. This material can be synthesized potentially at a much lower cost than its counterpart, single crystalline silicon, however conversion efficiency, $^{18}$ 19%, comparable to that of single crystalline silicon based cells can be obtained, so far, by only combining with the group II-VI compound semiconductor cells [Contreras M A, Egaas B, Ramanathan K, Hiltner J, Swartzlander A, Hasoon F, Noufi R. Progress toward 20% efficiency in Cu(In,Ga)Se polycrystalline thin-film solar cell. Progress in Photovoltaics: Research and Applications 1999; 7: 311-316.], which again raise issues associated with toxic natures of these materials.

A type of photovoltaic cells designed for several exclusive applications such as space, where the main focus is high conversion efficiency and cost is not the main factor. Generally, this solar cell consists of group III-V semiconductors including GaInP and GaAs. Synthesis processes of single crystalline group III-V are in general very costly because of substantial complications involved in epitaxial growth of group III-V single crystalline compound semiconductors. Typical conversion efficiency of group III-V compound semiconductor based photovoltaic cells, as these types of photovoltaic cells are intended to be, can be as high as ~34% when combined with germanium substrates, another very expensive material [King R R, Fetzer C M, Colter P C, Edmondson K M, Law D C, Stavrides A P, Yoon H, Kinsey G S, Cotal H L, Ermer J H, Sherif R A, Karam N H. Lattice-matched and metamorphic GaInP/GaInAs/Ge concentrator solar cells. Proceedings of the World Conference on Photovoltaic Energy Conversion (WCPEC-3), Osaka, May 2003; to be published.], usually more than 10 times than the conventional Si-solar cell.

All types of photovoltaic cells in the prior arts described above, no matter what materials a cell is made of, essentially falls into one specific type of structure, which usually limits is power generation capability. Usually flat pn-junction structure is used in conventional solar cells (FIG. 1A). Shown in FIG. 1A is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generate electron-hole pairs after being absorbed by the p- and also n-type semiconductor layers 101 and 102. The incident light generates electrons 105 *e* and also holes 105 *h* in the region near the pn-junction 103 and also 106 *e* and 106 *h* in the region far from the pn-junction 103. The photo generated electrons (and holes) 105 *e* and 106 *e* (hereafter considering only electronics, i.e. minority carriers in p-type semiconductors, and the same explanation is applicable for holes, minority carriers in n-type semiconductors, also) diffusing toward the pn-junction 103 and entering the pn-junction 103 contribute to photovoltaic effect. This is also vice versa for the holes, existing as minority carriers in n-type semiconductor 102. The two key factors that substantially impact the conversion efficiency of this type of photovoltaic cell are photo carrier generation efficiency (PCGE) and photo carrier collection efficiency (PCCE).

The PCGE is the percentage of the number of photons entering a cell and contributing to the generation of photo carriers, which needs to be, ideally, as close as 100%. On the other hand, the PCCE is the percentage of the number of photo-generated electrons 105 *e* and 106 *e* reaching the pn-junction 103 and contributing to the generation of photocurrent. For a monochromatic light, the PCGE of ~100% can be achieved by simply making the p-type layer 101 thicker, however, electrons 106 *e* generated at the region far away from the pn-junction 103 cannot be collected efficiently due to many adverse recombination processes that prevent photo generated carriers from diffusing into the pn-junction 103, thus the basic structure of current photovoltaic cells has its own limitation on increasing the conversion efficiency. As the minority carrier travel through the semiconductors, the longer the life-time, the less the recombination, which makes the higher the conversion efficiency. Usually, using of thicker and high quality wafer, the conversion efficiency of conventional solar cell can be increased to some extend mentioned earlier. However, this makes the solar cell costly and heavier. In addition to increase the collection efficiency, the absorption of the broad solar spectrum also increase the conversion efficiency.

Furthermore, increasing of the intensity of the solar spectrum helps to also increase the conversion efficiency, thereby increasing the power generation capacity. Conventionally, using of the concentrator separately with solar cell is used to increase the conversion efficiency. It requires additional component with solar cell to concentrate the solar spectrum.

It is highly desirable to have the solar cell structure having (a) high PCCE which is independent to the substrate thickness, (b) the ability of absorption of broad solar spectrum, and (c) self-concentrating capability to increase the intensity of solar spectrum incident per unit area.

FIG. 1B shows typical monochromatic light intensity behavior inside the semiconductor, and the light intensity p at certain depth x can be expressed as $p(x)=P_o \exp(-\alpha x)$, where $P_o$ is the peak intensity at the surface and $a$ is the absorption co-efficient of the semiconductor in which light is entering. As shown in FIG. 1B, the light intensity behavior 108 inside bulk semiconductors is exponential. Carriers (not shown here) generated due to light flux 112 absorbed by pn-junction is only drifted by junction field and can be collected efficiently. Whereas, carriers 106 *e* and 106 *h* generated due to absorption of light-flux 110 by semiconductor region 101 are diffused to all direction. Only those which are generated closer (distance equal to or less than the diffusion-length of the semiconductor) to pn-junction, can be collected. Those carriers which are generated far away (distance longer than the diffusion-length of the semiconductor) from pn-junction are recombined and lost. The light flux 112 is usually lost either by going out or absorbed by the substrate. Both PCGE and PCCE are mainly dependent on material and structure of the photovoltaic cells, and today's photovoltaic cells are structured in such a way that (a) wide ranges of solar spectrum cannot be absorbed due to its material limitation, and (b) photo carrier's collection efficiency is lower due to its inherent structure. For example, it is found that typical conversion efficiency of today's crystal-Si based solar cell is ~18%. Wavelengths of solar spectrum spreads from <0.1 to 3.5 μm in which Si can only absorb ~0.4 to 0.9 μm of light. ~50% of light belong to solar spectrum can not be absorbed by Si, due to have its inherent material properties. The rest of 32% are lost due to (i) recombination of photo-generated carriers and (ii) losing of light which is 112 as shown in FIG. 1B, and these two factors are structure dependent. If we could reduce these two factors, ~50% conversion efficiency can be achieved even in Si-based solar cell. If we could capture different wavelengths of light belonged to solar spectrum by utilizing different material systems or nano-material systems, we could increase the conversion efficiency ideally close to 100%. Furthermore, if the solar cell (photovoltaic cell) detection capability can be extended to infrared-spectrum, then the cell can produce electrical energy not only during day (while sun is present), but also at night (when different infrared is present). Besides, today's solar cell material is not highly radiation-tolerant. In space application, specially, photovoltaic cells should have a structure and material systems, which could generate high-power per unit area and also to highly radiation tolerant. To increase the conversion efficiency (ideally close to 100%), it would be desirable to have photovoltaic cell structures (a) which has larger surface area to volume ratio to capture all the photons (at specific wavelength) entering the cell and a pn-junction that is located at as close to the photo absorption region as possible, (b) amplifying capabilities by concentrating the light incident to its surface, and (c) structure comprising with the material systems having photo responses at different spectrum to efficiently cover a wide range of spectrum of light that enters a photovoltaic cell. It would be further desirable to have solar cell which could generate electric power in both day and night.

In addition to conversion efficiency, cost-effective manufacturing is also another factor requiring some focus. In today's solar cell, high-cost is also one of the main factor in addition to issue of low conversion efficiency. It is found that more than 90% of solar cell is silicon (Si) based solar cell in which crystal silicon (Si) wafer is the based material, and the rest of others are thin-film based solar cell. In manufacturing of Si-based solar cell, more than 50% of cost is originated from Si-wafer cost and the rest are from other cost such as process and integration. Usage of less silicon for the fixed conversion efficiency would help to reduce the power generation cost. It is highly desirable to focus onto the less usage of Si (to reduce the wafer cost) at the same time while increasing the conversion efficiency.

BRIEF SUMMARY OF THE INVENTION

Accordingly, it is an object of the invention to provide the structures of the photovoltaic cells, which could have high power generation capability per unit area over conventional counterpart, mentioned as the prior arts.

According to this invention, it is an object to have an photovoltaic cell structure having self-concentrating capabilities to amplify the solar spectrum incident onto its surface.

According to this invention, it is an object to reduce the carriers-recombination and also to increase the absorption of the light by increasing the effective junction area, which increases the photo-generated carriers.

According to this invention, it is an object to increase the absorption bandwidth of solar spectrum to increase the conversion efficiency.

It is an object providing solar cell structures based on nano-scaled blocks structures which is formed on the base substrate. The pn- or Schottky junction are formed with nano blocks, generating built-in potential by which photo generated electrons and holes are swept away, leading to photovoltaic effect.

Alternatively, the base substrate or carrier substrate could be formed in micro-nano blocks (structures) by either molding or etching process, and the junction is formed utilizing the similar semiconductor or two different type of semiconductors deposited on the micro-nano blocks. The base or carrier substrate could be semiconductor, metal or dielectric material. The pn- or Schottky junction are formed with nano-blocks, generating built-in potential by which photo generated electrons and holes are swept away, leading to photovoltaic effect.

It is an object to increase the surface area to increase the incident light intensity per unit its base area.

It is an object providing various solar cell structures based on trapezoidal, pyramid, cone, or cylindrical to increase the ratio of junction area to the volume, to increase the conversion efficiency According to this invention, the supporting substrate can be Si, CdTe, Cu, GaAs, InP, GaN, glass, polymer, ceramics, metal foil, Ge, C, ZnO, BN, Al2O3, AlN, Si:Ge, CuInSe, II-VI and III-V.

It is also object to form the structure made from electronics materials on which semiconductor pn, schotky, or MIS junction can be forced and that electronics materials can be formed on the base substrate like Si, Ge, metal-foil, or glass to make the low-cost.

It is also another object of this invention to provide the structures of the photovoltaic cells which can capture most of the wavelengths belonged to solar spectrum and can provide >80% conversion efficiency.

It is also another object of this invention to provide the structures of the photovoltaic cells which can generate the electric power in both day and night.

It is also another object of this invention to provide low-cost manufacturing process for the photovoltaic cell for making.

This invention offers to achieve ideally >50% of conversion efficiency utilizing Si-materials and >80% of conversion efficiency for other materials. The main advantages of these inventions are that today's matured process technologies can be used to fabricate the photovoltaic cell which has the power generation capability a few order and beyond as compared with that of conventional photovoltaic cell.

It is also another object of this invention to provide the structures of the antireflection coating which can reflects more than less than 1% light reflection over broad spectrum ranges.

Other objects, features, and advantages of the present invention will be apparent from the accompanying drawings and from the detailed description that follows below.

Further embodiments, forms, features, objects, and advantages of the present invention will be apparent from the following description.

Further embodiments include an ultrathin Si solar cell, which uses curved surface nano-pyramids on top of plane silicon. Structures may have a quintic shape used to better reflect light and increase absorption.

BRIEF DESCRIPTION OF THE DRAWINGS

The invention will be explained in more detail in conjunction with the appended drawings wherein:

FIGS. 2A and 2B are the schematics showing the top and cross-sectional views of photovoltaic cell based on the cone(pyramid)-structure to show the benefit of the invention, in accordance to the present invention.

FIGS. 2C and 2D are the cross-sectional views as seen from A-A' section of the FIG. 2A to show the physical parameters used in the description of the preferred embodiment.

FIGS. 6A, 6B, and 6C are the cross-sectional views of various photovoltaic cells formed on the electronic materials according to this invention, wherein the structures are similar to those as described in FIGS. 2 and 5A.

FIG. 8 is the cross-sectional view of a thin-film based photovoltaic cell formed on the substrate acting as the carrier substrate according to this invention, wherein

FIGS. 10A, 10B, and 10C are the schematics, showing quintic shaped or quintic like structures used to achieve the benefit of a large junction area in the preferred embodiment, wherein FIG. 10A shows an array of quintic shape structure or quintic shaped pyramids, and FIG. 10B shows a zoomedin view of a single quintic shaped pyramid, 10C shows variations of refractive indexes with respect to variation in heights in a quintic structure.

FIGS. 11A, 11B, and 11C, show the absorption under AM1.5 radiation (1 kW/m$^2$) in the preferred embodiments according to this invention, wherein FIG. 11A shows absorption distribution with variation of a base and a height of a quintic structure pyramid, wherein FIG. 11B shows the absorption with respect to variation of heights of quintic structure pyramids for a fixed length of square base, wherein FIG. 11C shows the absorption with respect to variations of the length of the square bases of quintic structure pyramids for a fixed height.

FIGS. 13A, 13B, 13C, 13D, 13E and 13F are the cross-sectional views of various photovoltaic cells, comprising with a quintic shaped structures, in the preferred embodiments according to this invention, wherein FIG. 13A depicts the structures with a semiconductor substrate or the conductive metallic layer, wherein FIG. 13B depicts the structures with gaps present between each quintic shaped structure, wherein FIG. 13C shows a photovoltaic structure having the quintic shaped structure are conjoined at the end of each structure, and wherein FIG. 13D shows a photovoltaic structure having quintic structures with a truncated top, wherein FIG. 13E shows a photovoltaic structure having quintic shaped structures are oriented or aligned at an angle with respect to vertical direction. FIG. 13F shows a photovoltaic structure having the quintic structures formed at an angle, and not perpendicular to the substrate.

FIGS. 14A and 14B show the cross-sectional views of a photovoltaic cell comprising with a micro-nano shaped quintic structures in the preferred embodiments according to this invention, wherein, FIG. 14A shows the structure of a photovoltaic with a quintic-shaped structures formed from a non-electrically conductive material, and wherein FIG. 14B is photovoltaic cell structure with a quintic-shaped structure formed on an eclectically conductive material.

FIGS. 15A, 15B, and 15C are the cross-sectional views of photovoltaic cell structure a comprising with a quintic shaped structure in the preferred embodiments according to this invention, wherein, FIG. 15A is the photovoltaic cell with a quintic shaped structure formed from a material, with or without a part of an active material forming the photovoltaic cell, and used as a trap structure at the bottom of the photovoltaic cell, wherein FIG. 15B is the photovoltaic cell comprising with a quintic-shaped structures applied to the bottom of the cell to act as a trap structure, and the electrode is disposed on to the top of the cell acts as a trap structure for light reflected back toward the top of the cell, and wherein FIG. 15C is a cross sectional view of a photovoltaic cell comprising with a quintic structure acting as the reflective layer formed either on the electrode and/or formed from the first electrode to scatter the light in the pn junction.

DETAILED DESCRIPTION

According to this present invention it is our object providing several photovoltaic cell structures which have (a) capability of higher surface area to volume, (b) self concentrating capability, (c) absorption of broad spectrum, and (d) pn-junction very close to the surface. These all capabilities would help to increase conversion efficiency as high as >60%. Before proceeding to give a detail explanation of the photovoltaic cell structure and their manufacturing, various structures including simulation results are given to show the benefits of the increasing the surface area (equivalent to junction area) and self-concentrating capability in the photovoltaic cell.

Reference is made in detail to the preferred embodiments of the invention. While the invention is described in conjunction with the preferred embodiments, the invention is not intended to be limited by these preferred embodiments. The contemplated embodiments for carrying out the present invention are described in turn with reference to the accompanying figures.

The term electrically connected is defined to encompass an electrical current flow, including bidirectional, unidirectional, or any hybrid current flow, such as an uneven current.

Figure 2D:
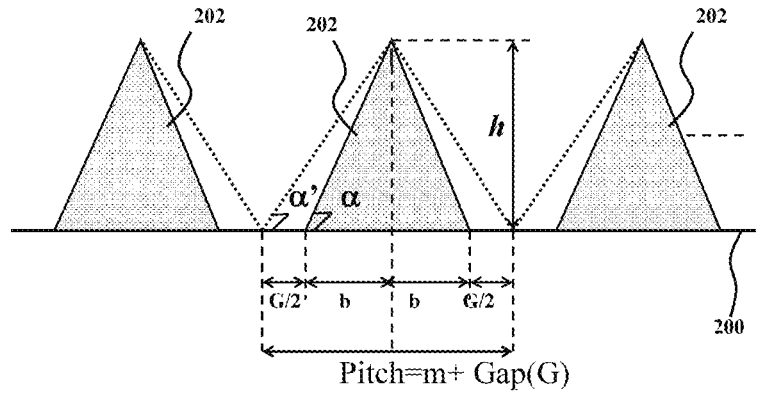

FIGS. 2A and 2B are the schematics representing the cone (or pyramid)-type structure 202 formed with the micro (or nano) block structures. The cone-structures are formed with specified pitch and base width m, and height k. They are formed onto the substrate 200. Alternatively, cone-structure 202 can be part of the substrate 200. In FIG. 2A, am number of the cone-structure 202 are arranged in are sized substrate 200 with thickness t. It is assumed that if we could make the am number of cone-like structure 202 on the axa-base-area, it will increase the surface area. This indicates that the increment of the surface area in the proposed cell is higher than that of compared with the conventional photovoltaic cell which is usually flat. As shown in FIGS. 2C and 2D, consider the gap between two pyramids (or cone) is G, base width is 2b (=m), and pitch of the pyramid arranged on the base, is 2b+G. The maximum ($b_{max}$) base width is 2b+G/2 and minimum base width ($b_{min}$) is zero (0). Pyramid height is considered to be h. As the height varies, the angle α also varies. The angle of the tilted side with respect to the base is α. The maximum attainable angle is 90 degree and minimum angle is α', as shown in FIG. 2C.

Figure 3A:
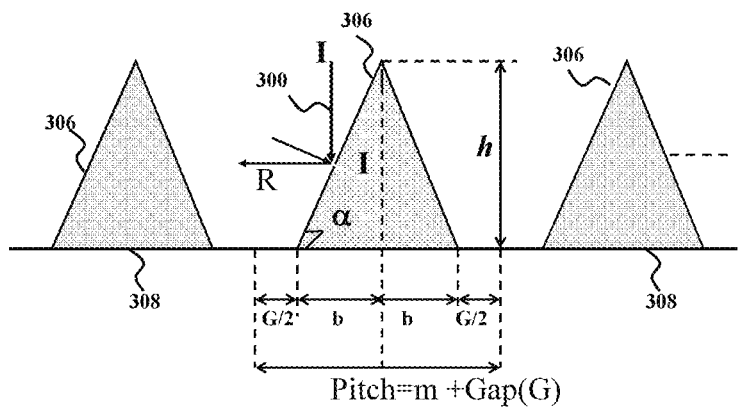
FIGS. 3A and 3B are the schematics showing the cross-sectional views as seen from A-A' section of FIG. 2A and also showing the effect of other nearest neighbors-pyramid blocks in total effective light, incident to its tilted side, in accordance to the present invention.
Figure 3B:
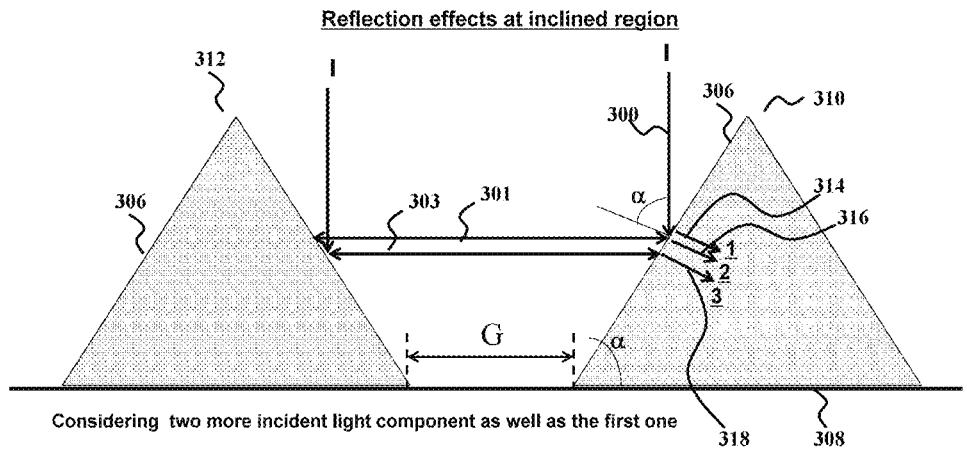

By varying the tilted angle α with adjusting of the height h, the intensity of solar light incident onto the tilted side and the gap, can be changed. FIGS. 3A and 3B are the schematics showing how solar light is reflected and change their direction after incident onto the proposed cell structure, as explained in FIG. 2. As shown in FIG. 3A, if the light intensity I 300 (from solar) is incident onto the side 306, whose angle is a with respect to the base 308, the light transmitted into the cell I' from the tilted side 306 is equal to Icosa and reflected light R=I(1−cos α). When the angle α' is minimum (see FIG. 2D), the maximum transmission of the solar light into the cell is possible from the tilted side 306.

Several reflections and transmission components are expected as shown in FIG. 3B, while solar light incident onto the tilted side 306 of one pyramid 310 (for example) and also its closet pyramid (or cone) 312. Assuming three components of transmitted lights into the cell from the tilted side, due to incident to close neighbors, first transmission component 314 is due to its own light I which is 300, and second transmitted component 316 is due to its own reflected light component 301 just after reflection from other pyramid 312, located very close to it. Third transmitted component 318 is due to the reflected light 303 from nearest pyramid 312. The first, second, and third light components 314, 316, and 318, respectively can be expressed as, First component: $I \times \cos \alpha$ (1)

Second component: $(I \times \cos \alpha)/(1-(1-\cos \alpha)^2)$ (2)

Third Component: $(I \times \cos \alpha (1-\cos \alpha))/(1-(1-\cos \alpha)^2)$ (3)

Where, I is the light intensity per unit area and a is the tilted side 206 angle with respect to base 308. Three components (314, 316, and 318) are only considered. Other order of reflection components also transmitted and they are very minimal as compared with those of three components mentioned. Tilted side 306 is not only higher surface area than the base (according to the Pithagorean Theory). Increasing surface area with comparable light intensity incident and transmitted to the titled surface having larger area than that of base area (like flat cell) will help to increase the carrier generation.

Figure 3C:
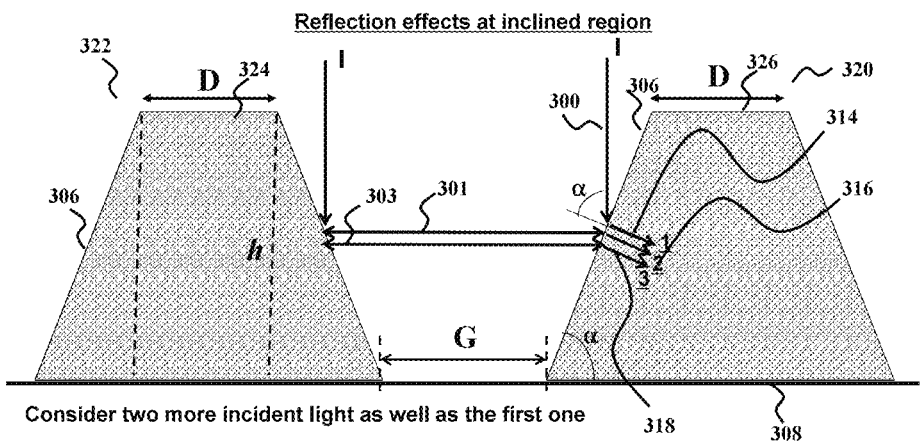
FIG. 3C is the cross-sectional view of the photovoltaic cell made from trapezoidal blocks showing the effect of nearest neighbor-blocks effect and also showing their different light components incident and transmitted to the tilted side.

FIG. 3C is the schematic showing how solar light is reflected and change their direction after incident onto the trapezoidal shaped structure. The explanation and numeral as used in FIGS. 3A and 3B are the same for FIG. 3C, so that repeated explanation is omitted here. Only difference is that the trapezoidal shaped structures 320 and 322 and the top base 324 are used in FIG. 3C. The light component transmitted to the cell and reflection due to the tilted side 306, as explained in FIG. 3B is also the same in the case of FIG. 3C.

In pyramid or trapezoidal structures as explained in FIG. 3A thru 3B, tilted side 306 has the same effect and the transmitted light components are the same for the same height of h. Light component I (300) incident on to the flat surface for example on the open top surface (for the case of FIG. 3C) 326 and the light component I' 328 incident on the flat surface created due to the gap 330 between two trapezoids 320 and 322, are different in intensity. The intensity I' of light 328 incident on to the flat surface 330 located in between two trapezoids 320 and 322 is higher than those I of light 300 incident onto the top-flat surface 326 (e.g. top surface of FIGS. 3C and 3D). The light is concentrated and incident in between the trapezoids due to the multiple reflection beams from tilted side 306 which creates the angle α with respect to the base 308. The effective light beams intensity, incident onto the surface 330 located in between two trapezoids 320 and 322 is dependent onto the angle α. The intensity of light incident onto the opening surface 330 is dependent onto the angle α, the trapezoids height h, and the gap G.

Figures 1A, 1B:
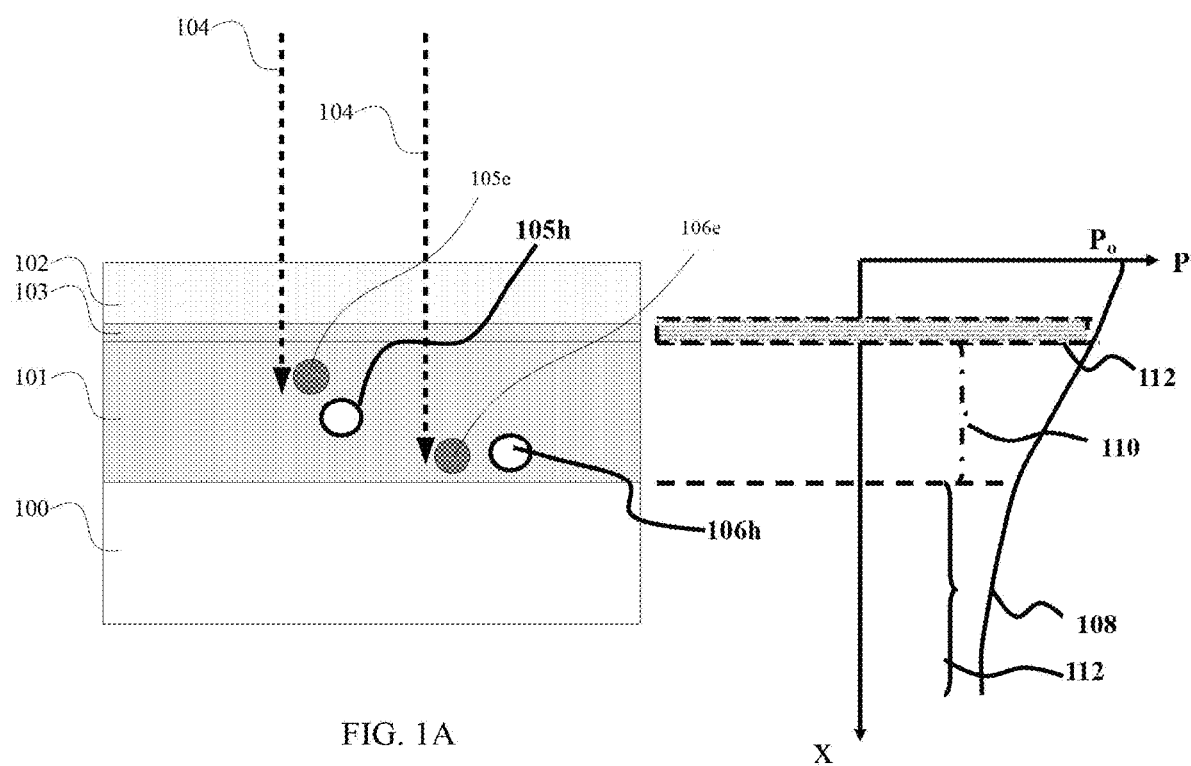
FIGS. 1A and 1B are the schematics showing the cross-sectional views of a conventional photovoltaic cell and light intensity behavior, respectively. These are the explanatory diagrams representing today's photovoltaic cell and the light intensity behavior inside the Cell.
Figure 3D:
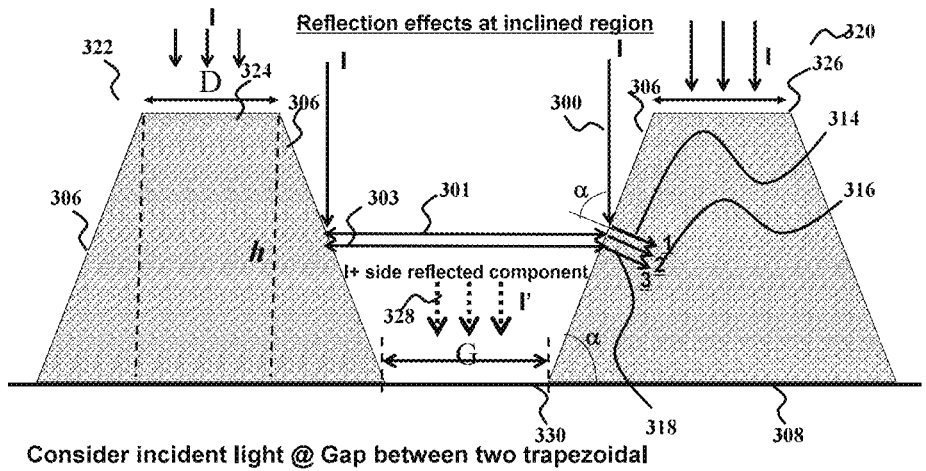
FIG. 3D is the schematic showing cross-sectional view of the photovoltaic cell comprising with trapezoidal blocks to show the amplifying or concentrating of the light intensity, incident on to the gap (G) region in between two blocks.
Figure 4A:
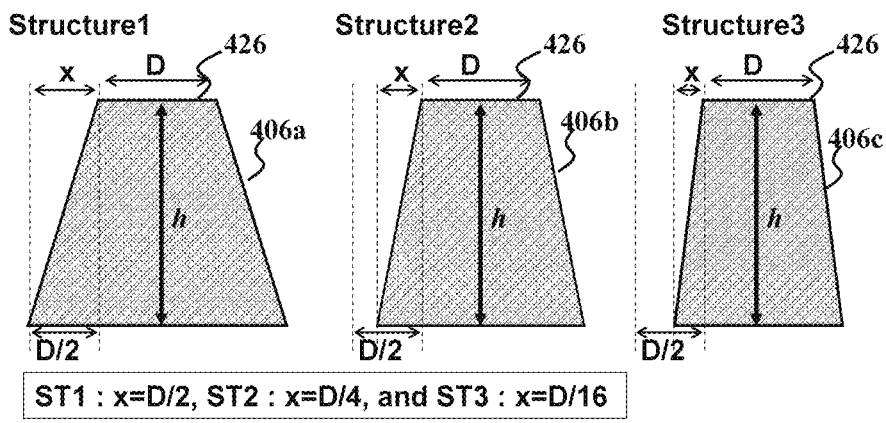
FIGS. 4A and 4B are the schematics showing cross-sectional views of the photovoltaic cell along with their physical parameters and the estimated conversion efficiency. Only closet surrounding block-effect is considered in estimating the conversion efficiency.
Figure 4B:
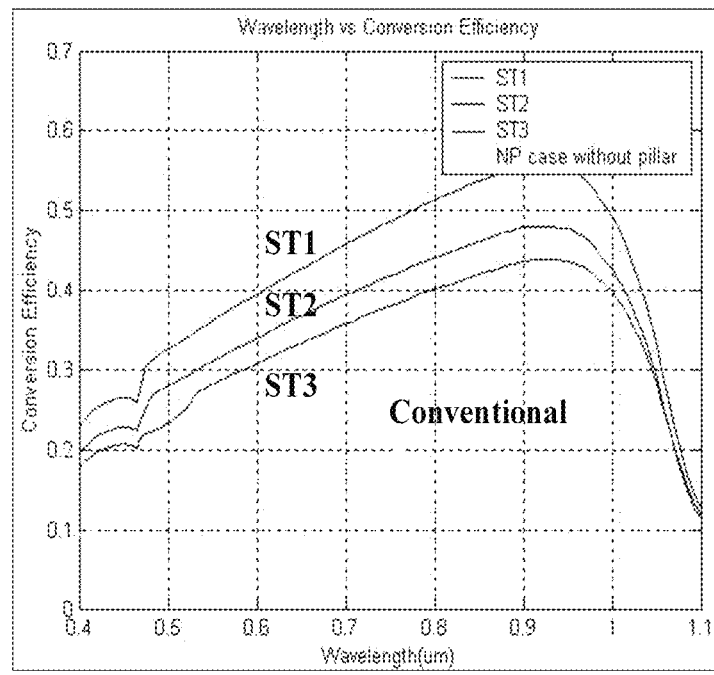

Conversion efficiency for the structure as shown in FIG. 3D is performed for the three variations of three structures as shown in FIG. 4A, the tilted sides of 406a, 406b, and 406c. The tilted angles and the gaps between two trapezoids (not shown here) are changed for the three structures as shown in FIG. 4A. Changing the tilted angle changes the gap between two trapezoids (not shown here) for the fixed height of the trapezoids. The distance between center and the edge of the trapezoids is considered here as X, and the X changed for estimating the conversion efficiency were D/2, D/4, and D/16, where D is the flat width of the top opening surface 426. FIG. 4B are the results for the photovoltaic cell based on to then trapezoids structures of having three different angle. Results has been compared with that of the conventional photovoltaic cell (as shown in FIG. 1) having the flat surface. Noted here that the estimated results is for the Si—PV having substrate thick ness of 350 µm, width (D) of trapezoids open top open surface and the gap (G) considering vertical cylindrical case, are 0.3 µm. The results showed that higher conversion efficiency over 40% could be achieved for all the trapezoidal structures, as shown in FIG. 4A. More higher conversion efficiency is also expected once the all parameters such as cell's structural and physical parameters, substrate parameters are optimized, Higher conversion as compared with the conventional photovoltaic cell is possible due to increasing of the surface area of the photovoltaic cell and also increasing of the solar spectrum intensity by self concentrating effect, as explained in FIGS. 3A, 3B, 3C, and 3D.

Figure 5A:
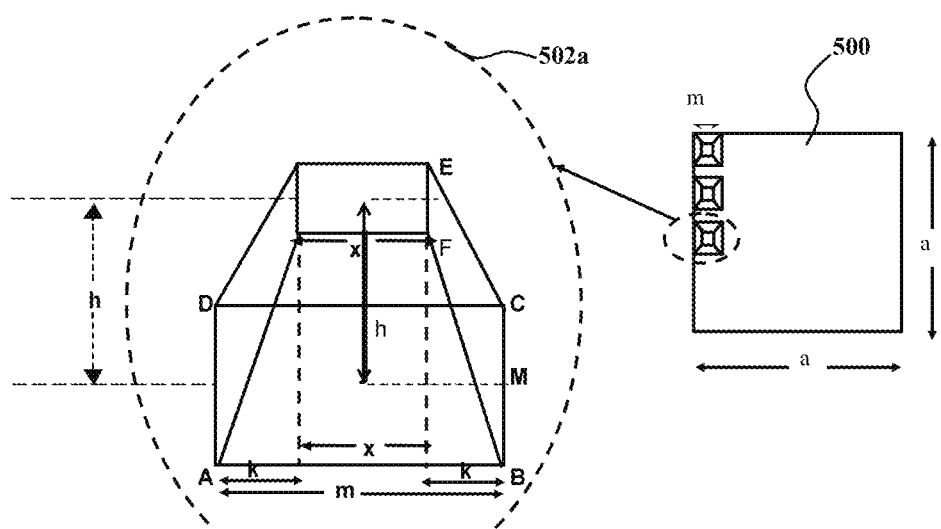
FIGS. 5A, 5B, and 5C are the schematics showing cross-sectional views of various structures for photovoltaic cells according to this invention.
Figure 5B:
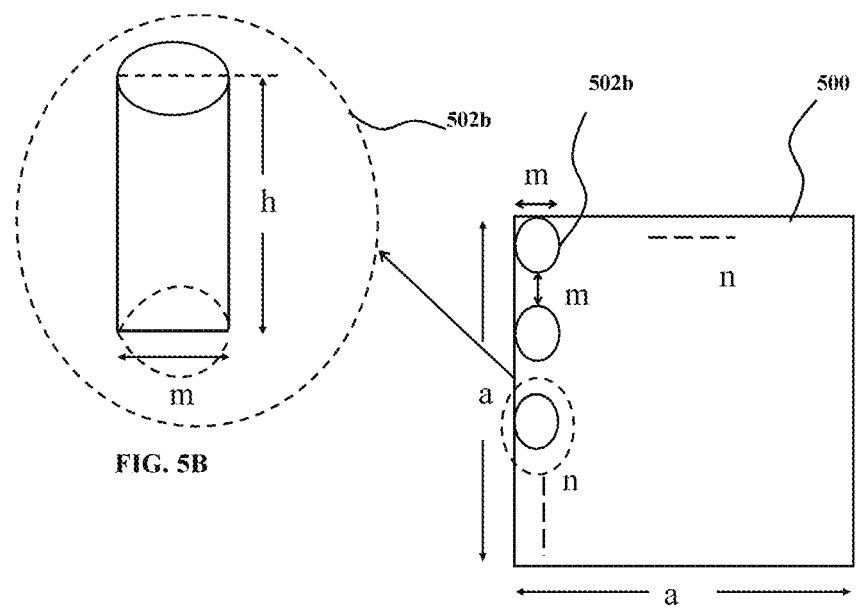
Figure 5C:
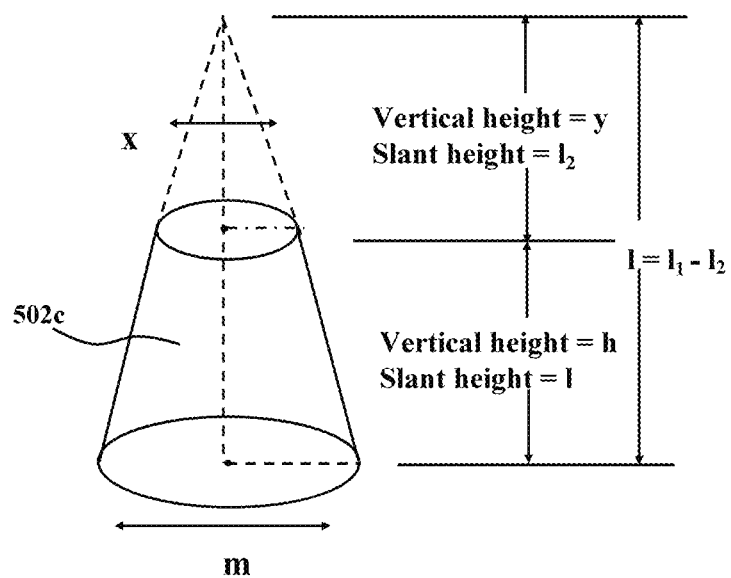

Increasing of the conversion efficiency for the fixed exposed area utilizing of the trapezoidal structure help to increase of the higher short circuit current as compared with that of the conventional photovoltaic cell of having flat surface. If the area increases, the number of the trapezoids is also increased and the short circuit will be increased tremendously. The conversion efficiency is expected to increase for all vertical structures such as the cylindrical, trapezoidal, cone (or pyramid) etc. FIGS. 5A, 5B, and 5C are the schematics of the photovoltaic cells made from the trapezoids, cylindrical, and pyramid structure according to this invention. They are uniformly arranged on the substrate 500. Each cell comprising of the different structure. For example, cell can be comprised with trapezoids structure 502a, cylindrical structure 502b, or trapezoidal originated from cylinder 502c etc. Alternatively, cell can be comprised with mixing of two or all, convenient to manufacturing process. In each case, a number of the structures (e.g. trapezoids, cylindrical etc) are arranged in axa sized substrate. For each cases, the ratio of the surface area to the total base area of axa is increased with reducing of their sizes. In all cases as shown in FIGS. 5A, 5B, and 5C, increasing the ratio indicates the increasing of the conversion efficiency as compared to that of the conventional cell having flat surface.

According to a preferred embodiment illustrated in FIG. 6A, shown is a photovoltaic cell comprising plurality of micrometer(s)-scaled pyramid 601 formed on the supporting substrate 600 (after having groove). The micrometer(s)-scaled pyramids 601 can have metallic electrical conduction, p-type or n-type semiconductor electrical conduction. The micrometer(s)-scaled pyramids are further surrounded by an electronic material 602 having metallic electrical conduction, p-type or n-type semiconductor electrical conduction. The electronic material 602 can be separated material or electronics materials of p or n type formed inside 601 and 600. The electronic material 602 and the supporting substrate 600 are further electrically connected to electrodes 603a and 603b, respectively. The electrode 603a and 603b are intended to serve as common electrodes that connect all pyramids 601. The electrode 603a is provided for the electronic material or junction 602. The electrode 603a can be transparent (not shown here) and can be formed on the electronic material or junction 602. The interface between the micrometer scaled pyramids 601 and the electronic material (or junction) 602 form pn- or Schottky junctions where built-in potential for both electrons and holes is generated.

According to this invention, alternatively the micrometer(s)-scaled pyramids 601 can be formed on separate substrate (not shown here), and the electrode 603b can be formed on the substrate to have common contact for each micrometer(s)-scaled pyramids 601, necessary for creating junction. In way of an example not way of limitation, the nanometer(s) or micrometer(s)-scaled pyramids 601 can be made of n-type semiconductor and the electric material 602 that on or surrounds the micrometer(s)-scaled pyramids 601 can be made of p-type semiconductor. Incident light 604 enters the photovoltaic cell through either the electrode 603a (not shown here) or on the material or junction 602. (In FIG. 6A, the incident light enters the photovoltaic cell through the electrode 602). The incident light 604 travels through pyramids 601, electronic material (n or p-type) or junction 602, and the substrate 600. As the incident light 604 travels through the micro-scaled pyramids 601, and electronic material 602, a numerous number of electrons (not shown here) are generated in the region near the electrode 603a. Portion of light 604 which passes through the valley portion of the pyramids where the electronic material 607 is used for passivation or make the junction in between micro-scaled pyramids 601 are traveled through the electronic material 602 and the supporting substrate 600 and generates electrons (not shown here). Some of which generated closer to electronic material 602 are collected and some of which are generated in the region far from 602 are recombined and lost. It should be pointed out that electrons are apparently generated all over the region along the thickness of the electric material or junction 602. In addition, as the incident light 604 travels through the micrometer(s)-scaled pyramids 601, a numerous number of holes (not shown here) are generated in the pyramids 601 and in the substrate 600, respectively. It also should be pointed out that holes are apparently generated all over the region along the thickness of the micrometer(s)-scaled pyramids 601 and the substrate 600. Photo-generated electrons generated in the electronic material 602, pyramids 601, and substrate 600 diffuse toward pn-junctions, created at the interface between the micrometer(s)-scaled pyramids 601 and the electronic material or junction 602, and also at the interface between the electronic material 602 and substrate 600. At the pn-junctions, the electrons and the holes are swept away by built-in potential, thus photovoltaic effects set in. As mentioned earlier, beam 604 incident on to the tilted surface 608 will have almost the intensity closer to the solar spectrum. As the surface area is increased due to utilize of the pyramid structure, the conversion efficiency is increased. As there are no gaps located in between two pyramid structures, beam concentration (considering the fixed base area) is only expected on the tilted surface.

Unlike conventional solar cell, the solar cell, as shown in FIG. 6A, has pn-junction in the regions of all sides 608 of the pyramids 601. The pn-junction formed on the side 608 of pyramids having height h has surface area, dependent on the height h of the pyramids 601. The light 604 travels perpendicular to the direction of the pn-junction formed across side 608 of the pyramids and most of the light flux incident on the pn-junction are absorbed and most of the photo-generated carriers can be collected. The light 604 travels perpendicular to the pn-junctions formed at the side 608 of the pyramids 601. Most of the light flux incident onto the sides can also be absorbed, and the carriers generated by the light 604 can be collected without recombination (ideally). It is apparent that utilizing the solar cell as shown in FIG. 6A can (i) reduce the recombination, (ii) increasing the surface increasing the more intensity for the fixed base area, and (ii) absorb all photo flux as transmitted to the semiconductor, thereby increasing the conversion efficiency.

According to a preferred embodiment illustrated in FIG. 6B, shown is a photovoltaic cell comprising plurality of micrometer(s) or nanometer(s)-scaled trapezoidal 610 formed on the supporting substrate 600 (after having groove). Only differences in FIG. 6B as compared with that of FIG. 6A is that the top 612 is opened and receives the portion of the light 604. Similar to FIG. 6A, this case also surface area of junction for receiving the light 604 is increased due to reduction of the photo-generated carrier recombination, increasing the surface area, basically increasing the more flux too incident, and absorption of all photo-flux incident on the surface and thereby increasing the conversion efficiency.

According to a preferred embodiment illustrated in FIG. 6C, shown is a photovoltaic cell comprising plurality of micrometer(s) or nanometer(s)-scaled trapezoidal 610 formed on the supporting substrate 600 (after having groove). Only differences in FIG. 6C as compared with that of FIG. 6B, is that the gap 614 is opened and receives the portion of the light 604. As mentioned earlier, based on the height h of the trapezoids and the side angle, the incident light 604 incident on to the gap located in between two trapezoids (e.g. 610 and 616), is concentrated and increase the conversion efficiency. Similar to FIGS. 6A and 6B, this case also surface area (corresponding to the junction area) for receiving the light 604 is increased due to reduction of the photo-generated carrier recombination, increasing the surface area, basically increasing the more flux too incident, concentrating incident light, and absorption of all photo-flux incident on the surface and thereby increasing the conversion efficiency.

Apparent advantage of this invention as shown in FIGS. 6A, 6B, and 6C, over conventional photovoltaic cells is directly associated with the fact that, unlike conventional photovoltaic cells, large portion of the pn-junctions are used for collecting all photo generated carriers created in the electronic material 602, no matter where they are generated, the distance the photo generated carriers have to diffuse to reach the pn-junctions created on the surface of the pyramids (601) or trapezoidal (610) is within the range of the diffusion length of the carriers and independent to the location where they are generated. Furthermore, for all photo generated carriers in the pyramids (601) or trapezoidal (610), no matter where they are generated, the distance the photo generated carriers have to diffuse to reach pn-junctions is within the range of the diffusion length of the carriers. Selecting height h and the base m of the pyramids (601) or trapezoidal (610), all carriers generated inside semiconductor can be collected. According to this invention, the recombination can be made to zero (ideally) and all photon flux can be absorbed (ideally), and the conversion efficiency can be made to ~100% and even >50% using of the Si. On the other hand, as explained in the description for the prior art shown in FIG. 1, in conventional photovoltaic cells where pn-junctions are perpendicular to the direction to which incident light travels, the photo generated carriers generated in region far away from pn-junctions need to diffuse much longer distance (diffusion-length) than that for the photo generated carriers generated near the pn-junctions, thus they have a greater chance to recombine without contributing to photovoltaic effects. Therefore in this invention, PCCE is expected to be much higher than that in conventional photovoltaic cells. In addition, it is evident that the total effective area that contributes to photovoltaic effect in this invention can be increased significantly a few orders (>3000) considering 300 mm diameter substrate, 500 μm height rods having 50 nm diameter and 50 nm pitch.

According to this invention, in way of an example not way of limitation, the supporting substrate 600 can be n-type or p-type Si of <100> orientation, on which the pyramids (601) or trapezoidal (610) can be formed by using the process of patterning using the standard photolithographic technique, and wet etching using of KOH solution. The dopants of opposite type of substrate can be diffused into the surface of the pyramids (601) or trapezoidal (610) to form the electronic material 602 of Si p-type. Conformal deposition of the dielectric material (not shown) can be done for planarization, and in this case silicon oxide or polymer can be used. Without dopant diffusion, the electronic material 602 can be separate Si-epitaxial growth to make the junction with the Si-substrate. According to this invention, in a way of an example not way of limitation, the supporting substrate 600 can be Ge, GaAs, InP, GaN, ZnO, CdTe, or any suitable semiconductor substrate etc. in which pyramids 601 or trapezoidal 610 can be formed. Alternatively, the supporting substrate 600 can be polymer material, metal (e.g. copper) on which semiconductor can be deposited or formed either by deposition or electrolytic way, ad the pyramid 601 and trapezoidal 610 are formed o the substrate prior to formation of semiconductor on it.

Figure 7A:
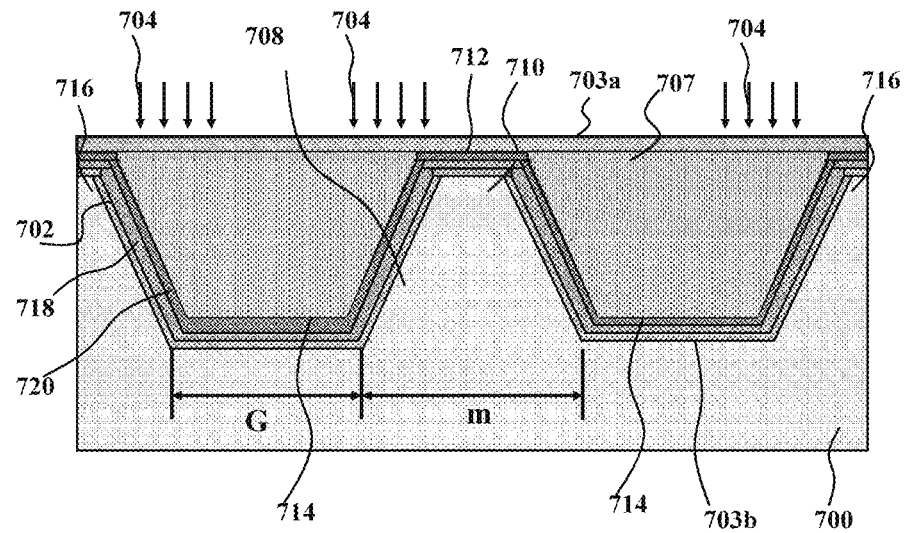
FIGS. 7A, 7B, 7C, and 7D are the cross-sectional views of photovoltaic cells made from thin film and formed on the electronic material substrate according to this invention.

According to a preferred embodiment illustrated in FIG. 7A, shown is a photovoltaic cell comprising plurality of micrometer(s)-scaled trapezoidal 710 formed on the supporting substrate 700 (after having groove). The micrometer(s)-scaled trapezoid 710 can have metallic electrical conduction, p-type or n-type semiconductor electrical conduction. The micrometer(s)-scaled trapezoids are further surrounded by an electronic material 718 and 720 having metallic electrical conduction, p-type or n-type semiconductor electrical conduction. The electronic materials 718 and 720 can be separated material or electronics materials of p or n type formed into the substrate 700. The electronic materials 718 and 720 having the junction of 702 are further electrically connected to electrodes 703a and 703b, respectively. The electrode 703a and 703b are intended to serve as common electrode that connects all trapezoids 710. The electrode 703a is provided for the electronic material or junction 702. The electrode 703a can be transparent (not shown here) and can be formed on the electronic material or junction 702. The interface between the micrometer scaled trapezoids 710 and the electronic material (or junction) 702 form pn- or Schottky junctions where built-in potential for both electrons and holes is generated. According to this invention, the substrate 700 acts as the carrier substrate for making the trapezoids 710. The substrate can be glass, metal, ceramics, polymer, or semiconductor. Alternatively, according to this invention, the carrier substrate can be the solid metal or metal foils (not shown here). In that case, the substrate 700 and the common electrode 703b can be the one material.

According to this invention, alternatively the micrometer(s)-scaled trapezoids 710 can be formed on utilizing the semiconductor substrate (not shown here), and the electrode 703b can be formed on back side of the substrate to have common contact for each micrometer(s)-scaled trapezoids 710, necessary for creating wide surface area. In way of an example not way of limitation, the nanometer(s) or micrometer(s)-scaled trapezoids 710 can be made of n-type semiconductor substrate and the thin film material that on or surrounds the micrometer(s)-scaled trapezoids 710 can be made of p-type semiconductor.

Incident light 704 enters the photovoltaic cell through either the electrode 703b (not shown here) or on to the top electrode 703a. (In FIG. 7A, the incident light enters the photovoltaic cell through the electrode 703a). The incident light 704 travels through trapezoids 710, electronic materials 718 and 720 (n or p-type) or junction 702, and the substrate 700. As the incident light 704 travels through the micro-scaled trapezoids 710, and electronic materials 720 and 718, junction 702, a numerous number of electrons (not shown here) are generated in the region near the electrode 703a. Portion of light 704 which passes through the opening portion located in between two trapezoids (e.g. 710 and 716) where the electronic material 707 is used for passivation or make the junction in between micro-scaled trapezoids 710 are traveled through the electronic materials 718 and 720, junction 702 and the supporting substrate 700 and generates electrons (not shown here). Some of which generated closer to electronic material/junction 702 are collected and some of which are generated in the region far from 702 or in the passivation layer 707, are recombined and lost. It should be pointed out that electrons are apparently generated all over the region along the thickness of the electric material (718 and 720) or junction 702. In addition, as the incident light 704 travels through the micrometer(s)-scaled trapezoids 710, a numerous number of holes (not shown here) are generated in the trapezoids 710. Photo-generated electrons generated in the electronic materials (718 and 720), junction 702, passivation 707, and substrate 700 diffuse toward pn-junctions 702, created at the interface between the electronic materials 718 and 720, and also at the interface between the electronic material 702 and substrate 700. At the pn-junctions, the electrons and the holes are swept away by built-in potential, thus photovoltaic effects set in. As mentioned earlier, beam 704 incidents on to the tilted surface 708 will have almost the intensity closer to the solar spectrum. As the surface area is increased due to utilize of the trapezoids structure, the conversion efficiency is increased. Light incident onto the to the gaps 714 located in between two trapezoids structures for example 710 and 716, beam is concentrated and increase the carrier generation. The beam concentration is also expected for the beam incident onto the tilted surface 708 is also expected as the surface area increases per fixed base area.

Unlike conventional solar cell, the solar cell, as shown in FIG. 7A, has pn-junction in the regions of all tilted sides 708 of the trapezoids 710 (and 716), the gap 714 created in between two trapezoids (e.g. 710 and 716). The pn-junction formed on the side 708 of trapezoids having height k has surface area, dependent on the height h of the trapezoids 710. The light 704 travels perpendicular to the direction of the cell and incident onto the top flat surface 712, tilted side 708, and the gap 714. The intensity of the light incident on to the top flat surface 712 is same as that of the original light intensity I of 704. Light incident onto the tilted surface 708 and open gap 714 have the intensity more than the intensity I, due to the self-concentrating by the cell structure and it explains as follows. When the light perpendicularly incident to the tilted side 708 of the trapezoids, and some of the light not shown is reflected and portion of light is transmitted into the pn-junction, not shown here (for details see FIGS. 3C and 3D). The light component from other trapezoids also reflected back and some portion is transmitted from nearest trapezoids tilted side 9 not shown here). It is estimated that light beam transmitted into the tilted side can be made more than 0.85 times of the original intensity of the light after optimizing the structure especially height h and angle α. Based on the side surface area increases per fixed area, the light intensity can be concentrated and amplified if we compare with the base area. The light 704 travels perpendicularly and incident on to the gap 714 has several components of light in addition to the light (I) incident perpendicularly. Other components (not shown here) are the reflected light components originated from the tilted side 708 of nearest trapezoids. Based on the aspect ratio (ratio of the height to gap of the trapezoids), the light incident onto the gap 714 (see 328 of FIG. 3D) can be enhanced or multiplied. According to this invention, the structure can be trapezoidal, cylindrical, pyramid etc. and they can be a part of the substrate or building block onto the substrate.

According to this invention, the light intensity incident onto the surface top, tilted, and gap, they are concentrated and they can be absorbed. The carriers generated by the all light component (not shown here) can be collected without recombination (ideally). It is apparent that utilizing the solar cell as shown in FIG. 7A can (i) reduce the recombination, (ii) increasing the surface increasing the more intensity for the fixed base area, and (ii) absorb all photo flux as transmitted to the semiconductor, thereby increasing the conversion efficiency.

Figure 7B:
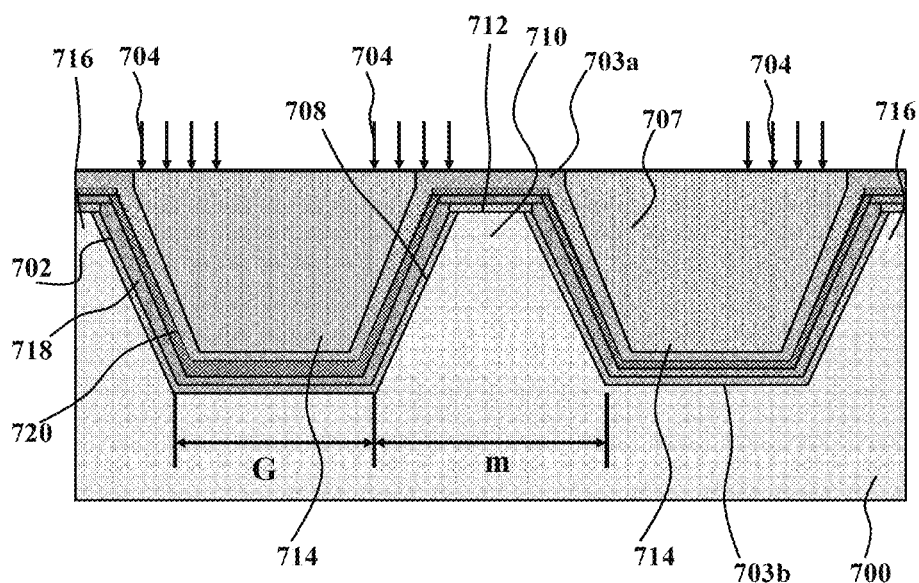

According to this present invention, alternatively the top electrode 703a can be made directly onto the top of the electronic material 720. FIG. 7B shows the schematic representing the photovoltaic cell according to this invention, wherein, the same numeral represent the same parts as explained in FIG. 7A, and repeated explanation is omitted here. The difference in FIG. 7B as compared to FIG. 7A is that, the electrode is made onto the electronic material 720 in all sides, for example top 712, tilted side 708, and the gap 714.

The photovoltaic cell explained in FIGS. 7A and 7B, are based onto the electronics materials 718 and 720 which can be based on the radiation tolerant materials for example CdS, CdTe etc. If those material or material systems which are not highly tolerant under radiation material systems such as Si, Polymer, GaAs, etc. are used, then the radiation tolerant material is to be needed to prevent the photovoltaic cell damage from radiation. According to this invention, at least one layer for example 722 (shown in FIG. 7C) is to be needed onto the top of the photovoltaic cell to prevent the photovoltaic cell from damaging due to the radiation. The additional layer 722 is made onto the top of the photovoltaic cell. The layer will reduce and/or completely alleviate the radiation dose exposing directly onto the photovoltaic cell. The difference in FIG. 7C as compared to FIG. 7B is that an additional layer 722 is used to protect from the radiation exposure.

Figure 7C:
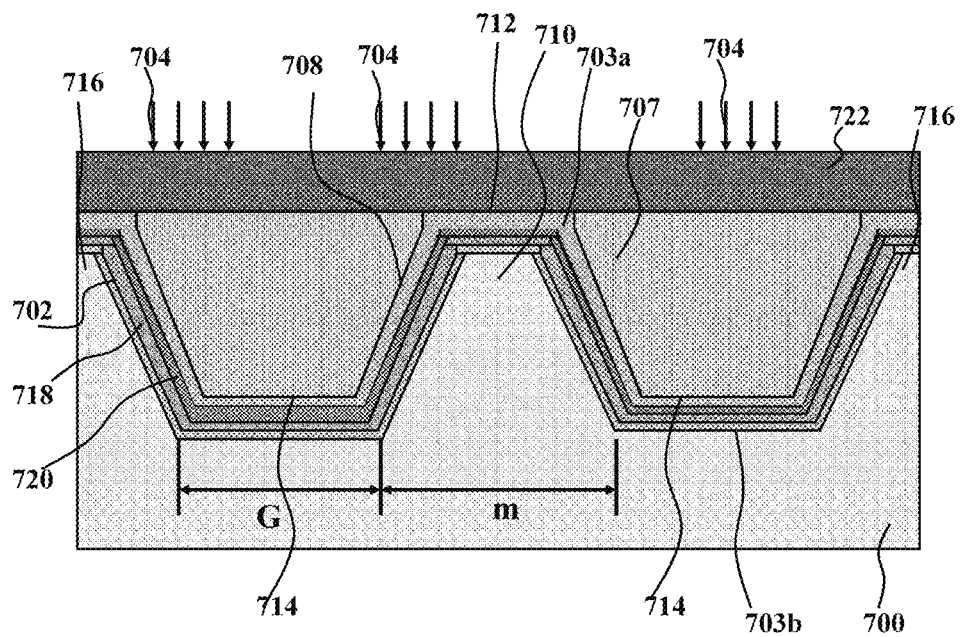
Figure 7D:
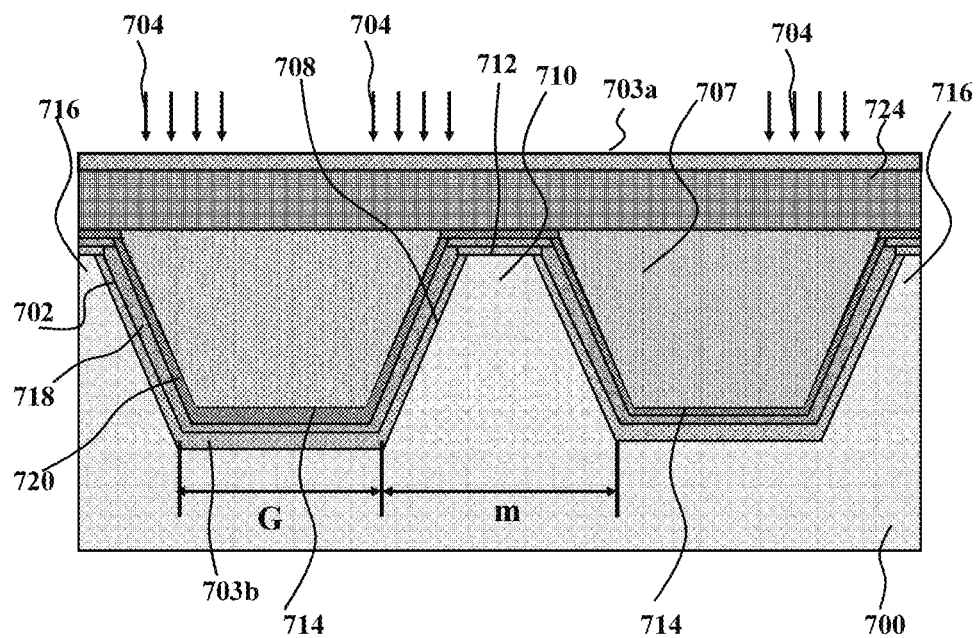

According to this invention, the photovoltaic cell can be made to have more than one junction. FIG. 7D is the schematic showing an cross-sectional view of photovoltaic cell wherein the same numerals are the same parts as explained in FIGS. 7A, 7B, and 7C, so that repeated explanation is omitted here. The top junction formed by the additional electronic material 724, can be flat and the second junction 702 can have larger surface area, as explained in FIGS. 6A, 6B, 7A, 7B, and 7C. The top junction formed by the electronic material 724 can absorb comparatively lower wavelength light and longer wavelength lights are absorbed by the second junction 702. In this way, the broad ranges of solar spectrum can be possible and the conversion efficiency can be further increased, according to this invention. Alternatively, type of top layer material 724 can be either electronic material to create the semiconductor junction or the material having high radiation tolerant for the case of the photovoltaic cell for space application. The difference in FIG. 7D, as compared to FIG. 7C, is that addition layer 724 is used either for creating an another junction to extend the solar spectrum absorption or to prevent the photovoltaic cell from the radiation exposure. Alternatively, more than two junctions utilizing the combination of flat and grooved junctions can also be used according to this invention.

According to this invention, explained in FIGS. 7A, 7B, 7C, and 7D, the substrate 700 can be act as the carrier substrate for creating the structures of trapezoids, pyramid, cylindrical etc. to have larger surface area (and also larger junction area). The type of substrate can be semiconductor, polymer, ceramic, solid metal, metal foil. In the case of the semiconductor using as carrier 700, a layer of dielectric material may be required to isolate the photovoltaic cell and semiconductor current injection or leaking (not shown here). If the solid metal or metal foil is used as the carrier substrate than the metal (used as the carrier substrate) can be also used one of the common electrode (or contact). If the ceramics or polymer is used as the carrier substrate is used, the structures of trapezoids, cylindrical, or pyramid etc. can be made on the substrate using molding, casting, etching, or printing technology.

According to this invention. alternatively, structures of trapezoids, cylindrical, or pyramid of same or different type of material can be made onto the carrier substrate by a process or transferring the pre-formed structures on foreign substrate (not shown here) are transferred to the substrate (700) acting as the carrier substrate.

Figure 8:
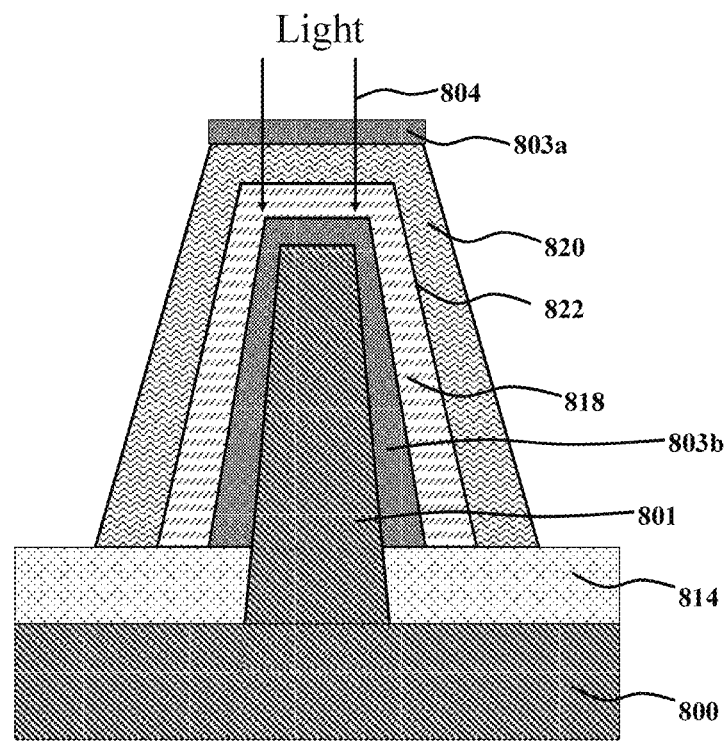

In an alternative preferred embodiment shown in FIG. 8, a photovoltaic cell comprises plurality of micro or nanometer(s)-scaled trapezoidal or cylinder 801 are electrically connected to a substrate 800. The cylinder or trapezoidal 801 can have metallic electrical conduction, p-type or n-type semiconductor electrical conduction. The dielectric layer 812 on the substrate 800 isolate the cylinder or trapezoidal shaped rods. The micro or nanometer(s)-scaled trapezoidal or cylinder 801 are further surrounded by electronic materials 818 and 820 having metallic electrical conduction, top and bottom contacts 803a and 703b. The electronic materials 818 and 820 form p-type or n-type semiconductor electrical junction 822. The electronic materials 818 and 820 can be separated material or electronics materials of p or n type formed inside or on 801 and 800. The electronic materials 818 and 820 are further electrically connected to electrodes 803a and 803b, respectively. The electrodes 803a and 803b are intended to serve as common electrodes that connect all cylinder or trapezoidal shaped electrical junction 822. The electrode 803a is on the electronic material 820. The interface between the nanometer(s)-scale tubes 818 and the electronic materials 820 form pn- or Schottky junctions 822, thus there are pn- or Schottky junctions on both sides, inside and outside, of the micro or nanometer(s)-scale trapezoidal or cylindrical rod 801.

According to this invention, alternatively the nanometer(s) or micrometer(s)-scale tubes, wires or trapezoids, 801 can be formed on the substrate (not shown here), and the electrode 803a can be made on the substrate to have a common contact for each nanometer(s)-scale rods 801, necessary for creating junction.

In a way of an example not way of limitation, the micro or nanometer(s)-scale trapezoidal or cylindrical rod 801 can be made of metal and the electronic materials 818 and 822 that surrounds or around the micro or nanometer(s)-scale trapezoidal or cylindrical rod 801 can be made of p-type semiconductor, thus the interface of 818/822 forms pn-junctions in micro or nanometer(s)-scale trapezoidal or cylindrical rod 801. Incident light 804 enters the photovoltaic cell through the electronic materials 820 (front-side of the cell). As the incident light 804 travels through the electronic material 820, numerous numbers of electrons (not shown here) are generated. It should be pointed out that electrons (of electron-hole pairs) are apparently generated all over the region along the thickness of the nanometer(s) or micrometer(s)-scale blocks (e.g. rods) 801 and also the gaps 814 in between blocks 801. Photo-generated electrons in the electronic materials 818 and 820 made of p and n-type-type semiconductors, then diffuse toward pn-junctions 822 in the interface of 818/820. At the pn-junctions, the diffused electrons are swept away by built-in potential, thus photovoltaic effects set in.

Common advantages already described for the photovoltaic cell in FIGS. 6 and 7, can be achieved in this invention. Only difference of forming the nano or micro-scaled blocks which are formed without forming the grooves.

According to this invention, in way of an example not way of limitation, the supporting substrate 800 can be Si substrate, on which trapezoidal or slanted cylinder can be made by conventional photolithography followed by wet etching using standard etchant (e.g. KOH solution). In order to isolate the slanted trapezoidal, dielectric layer of silicon oxide can be used. Different type of thin-films of p-type and n-type can be deposited on the slanted cylinder 801 after uniformly metallization to form the electrode 803$b$. The thin films could be any suitable thin films which could form the junction. For example, they are the combination of CdTe/CdS, Zn(Cd)Te/Zns, ZnO based materials, Si based alloyed material (e.g. Si:Ge or a-Si), GaAs or InP based alloyed materials etc. Conformal deposition of the electronic material can be done based on the slant angle and planarization (not shown here) can be made by depositing the passivation layer (polymer or silicon oxide).

According to this invention, in way of an example not way of limitation, the supporting substrate 800 can be Ge, GaAs, GaN, InP, GaN, CdTe, or ZnO.

Figure 9:
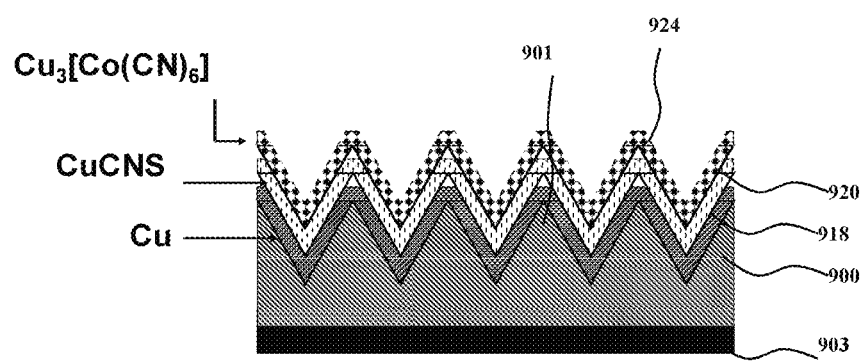
FIG. 9 is the schematic showing the cross-sectional view of photovoltaic cell structure based on the photochemical material in accordance with the present invention.

In an alternative preferred embodiment shown in FIG. 9, a photovoltaic cell comprises plurality of micro-meter(s) scaled pyramid or trapezoidal 801 are electrically connected to a substrate 900. The micro-meter(s) scaled pyramid or trapezoidal 901 are further surrounded by electronic materials 918 and 920 having metallic electrical conduction. The electronic materials 918, 920, and 924 and the supporting substrate 800 are further electrically connected to electrodes 903, respectively. The micro-meter(s) scaled pyramid or trapezoidal-shaped has top surface with electronic material of 924 can form the have metallic electrical conduction, with suitable electrolyte solution (not shown). For collecting the charge from the electrolyte, another electrode is placed in the electrolyte (not shown here).

The structures to increase the surface area (equivalent to the junction area) can be made alternatively by using the nano-blocks of having few nanometer sizes, the quantum confinement effect is possible. Absorption of broad solar spectrum can be possible utilizing the different sizes and different semiconductor nano-scaled blocks.

Apparent advantage of this invention over conventional photovoltaic cells is directly associated with the fact that, unlike conventional photovoltaic cells, at least one junction having larger surface area and also have the capability of self-concentration as explained in FIGS. 2 to 5 are created for increasing the carrier generation and also for collecting all photo generated carriers created in the absorption layer, no matter where they are generated. According to this invention, the recombination can be made to zero (ideally) and all photon flux can be absorbed (ideally), and the conversion efficiency can be made to ~100% and even >50% using of the Si. On the other hand, as explained in the description for the prior art shown in FIG. 1, in conventional photovoltaic cells where electrical-junctions are perpendicular to the direction to which incident light travels, the photo generated carriers generated in region far away from electrical-junctions need to diffuse much longer distance (diffusion-length) than that for the photo generated carriers generated near the junctions, thus they have a greater chance to recombine without contributing to photovoltaic effects. Therefore, in this invention, PCCE is expected to be much higher than that in conventional photovoltaic cells for specific wavelength. In addition, it is evident that the total effective area that contributes to photovoltaic effect in this invention can be increased significantly a few orders (>3000) and also the light incident onto the gap in between two structures have the concentrating light. Both effects will increase the carrier generations and thereby increase the conversion efficiency.

According to this invention, in way of an example not way of limitation, the supporting substrate (600, 700, 800, or 900) can be ceramics, glass, polymer or any kind of semiconductor on which transparent or nontransparent metal contact (603$b$, 703$b$, or 803$b$) is made. Alternatively, supporting substrate (600, 700, 800, or 900) can be metal which also acts the metal contact. For this case, copper, stainless steel, Aluminum, alloyed metal, or their thin metal foil, can be used. According to this invention, the nano or micro structured of trapezoids, cylinder, or pyramid, can be any kind of semiconductor or compound semiconductors, having the absorption capability in the desired spectrum region. They could be Si, Ge, InP, GaAs, CdSe, CdS, CdTe, ZnO, ZnTe, ZnCdTe, CuInSe, CuSe, InGaAs.

According to this invention, the nano or micro scaled structures could be GaN materials (n or p type) and the dozens of the materials could be $In_{1-x}Ga_xN$ (p or n type, opposite to GaN rods). With increasing of the Ga contents, the band-gap of InGaN can be increased to close to ~3.4 eV which is same as that of the GaN. With increasing of the In contents in InGaN, the band gap can be reduced to ~0.65 eV. Photons with less energy than the band gap slip right through. For example, red light photons are not absorbed by high-band-gap semiconductors. While photons with energy higher than the band gap are absorbed—for example, blue light photons in a low-band gap semiconductor—their excess energy is wasted as heat.

According to this invention, alternatively the, nano or micro scaled structures could be III-V based materials (n or p type) for example InP and the dozens of the materials could be III-V based material for example $In_{1-x}Ga_xAs$ (p or n type, opposite to InP rods). In this case, with adjusting of In contents, band gap can be tuned and thereby the wide spectrum of the solar energy can be absorbed.

According to this invention, alternatively nano or micro scaled structures could be II-V based materials (n or p type) for example CdTe and the dozens of the materials could be II-VI based material for example CdZnS (p or n type, opposite to CdTe rods) or Zn(Cd)Te/ZnS based materials. In this case, with adjusting of Zn contents, band gap can be tuned and thereby the wide spectrum of the solar energy can be absorbed.

According to this invention, alternatively nano or micro scaled structures, could be Si (or amorphous Silicon materials (n or p type) and the dozens of the materials could be Si:Ge alloy (p or n type, opposite to Si rods). In this case, with adjusting of Ge contents, band gap can be tuned and thereby the wide spectrum of the solar energy can be absorbed.

According to this invention, alternatively nano or micro scaled structures could be Si, InP, or CdTe (n or p type) and the dozens of the materials, could be different material which could make the junction with the rods (wires or tubes) and each type of material has the specific band gap for absorbing the specific range of solar spectrum. In this way also wide range of solar spectrum can be absorbed, and with increasing of the junction area (due to use of the rods, wires, or tubes), the electrical power generation could be increased tremendously 50 times and beyond.

According to this invention, the nanoparticles or nanometer(s)-scale wires, mentioned in the preferred embodiments, can be any kinds of electronics materials covering semiconductor, insulator or metal.

According to this invention, nano or micro scaled structures can be made from the semiconductors such as Si, Ge, or compound semiconductors from III-V or II-VI groups. As an example for rods, wire, or tubes, InP, GaAs, or GaN III-V compound semiconductor can be used and they can be made using standard growth process for example, MOCVD, MBE, or standard epitaxial growth. According to this invention, the self-assembled process can also be used to make wires, rods, or tubes and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

According to this invention, nano or micro scaled structures based on II-VI compound semiconductor can also be used. As an example CdTe, CdS, Cdse, ZnS, or ZnSe can also be used, and they can be made using standard growth process for example, sputtering, evaporation, MOCVD, MBE, or standard epitaxial growth or chemical synthesys. According to this invention, the self-assembled process can also be used to make nano or micro scaled structures, and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AN, Silicon-oxide etc.

According to this invention, nano or micro scaled structures can be made from the carbon type materials (semiconductor, insulators, or metal like performances) such as carbon nano-tubes, which could be single, or multiple layered. They can be made using standard growth process for example, MOCVD, MBE, or standard epitaxial growth. According to this invention, the self-assembled process can also be used to make wires, rods, or tubes and their related pn-junction to increase the junction area. These tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AN, Silicon-oxide etc.

According to this invention, alternatively the 3D structures (i.e. rods) could be III-V based materials (n or p type), for example InP, and other materials could be III-V based materials like $In_{1-x}Ga_xAs$ (p or n type, opposite to InP rods). In this case, by adjusting the In contents, the band gap can be tuned and thereby a wide spectrum of solar energy can be absorbed.

Alternatively, according to this invention, in way of an example not way of limitation, the photovoltaic cell comprising with a quintic-shaped micro-nano scaled structures can also be made as is shown in FIG. 10A, FIG. 10B and FIG. 10C, micro-nano scaled quintic shaped structure (i.e. pyramid shaped with curved surfaces) are used to increase significantly conversion efficiency of photovoltaic cell by increasing the surface area to volume. This allows reducing the amount of material used, and makes the photovoltaic cell flexible. FIG. 10A is the enlarged cross-sectional view of a part of photovoltaic cell using of a quintic shaped 3D structure in a preferred embodiment in accordance with the present invention, wherein like parts are indicated by like or similar reference numerals as used in FIGS. 6 to 9 so that a repeated explanation is omitted here. FIG. 10A depicts an embodiment where the micro-nano scaled pyramids with curved sides (i.e quintic shaped or quintic shaped like) are used. In an exemplary embodiment of the invention, a crystal-silicon (C—Si) cell is made in this configuration, where quintic structures 1001 are located on a top of plane silicon 1000 having a minimal thickness, ranging from 5 micrometer to 50 micrometer. The quintic micro-nano scaled structures may be etched or grown on the c-Si (for example as a substrate) using known techniques in the art. The variation of shape of micro-nano scaled structures from top to bottom (mentioning herewith as the "Quintic" structure) provides a gradual change in the effective refractive index from air to the plane silicon (as an example) and thus, reducing reflection losses. In an exemplary embodiment of the invention, in a way of an example not way of limitation FIG. 10B illustrates the structure which clearly indicates the quintic (second power and beyond) gradient of refractive index layer between air and silicon. According to this invention, the quintic gradient of refractive index layer between air and silicon can have more than $2^{nd}$ or more for achieving the refractive indexes gradient.

More specifically, in this specification, a quintic structure is a structure with inward curved sides that start at the base, and the slop at the top, become steeper as the material rises above the surface. This slope aliens with a quintic (i.e. third power and beyond) gradient index layer between air and the base material (i.e. semiconductor material). The quintic structure may change its angle in accordance to the gradient index layer between the materials used in the cell.

In the preferred embodiments as explained in FIGS. 10A and 10B, alternatively, the quintic-like structure may be used and the quintic-like structure are those structures, a combination of the conical, or pyramid and the quintic structure defined earlier.

Figure 11A:
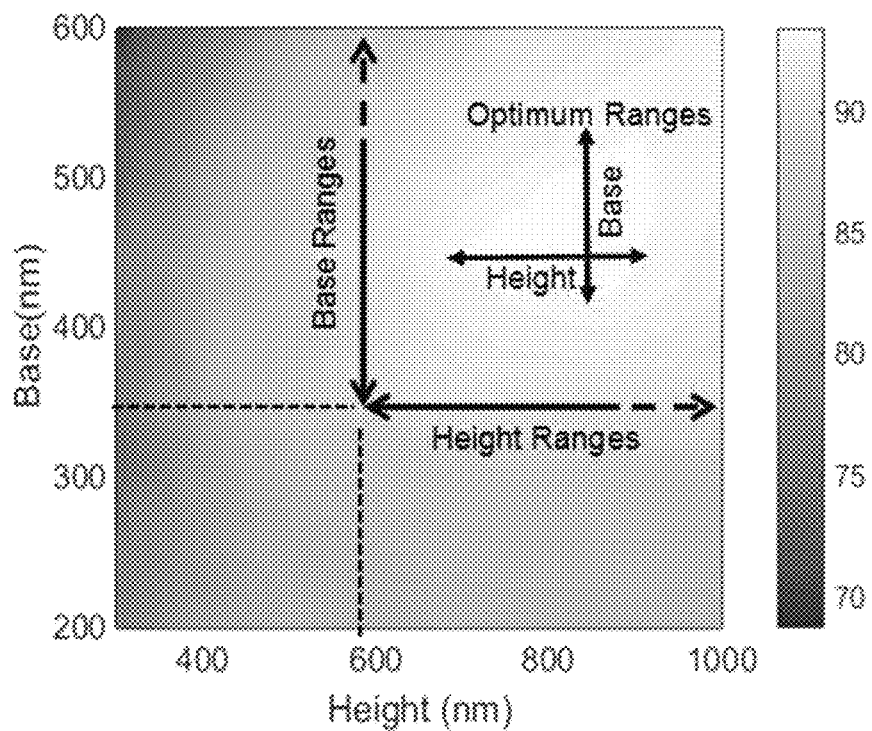
Figure 11B:
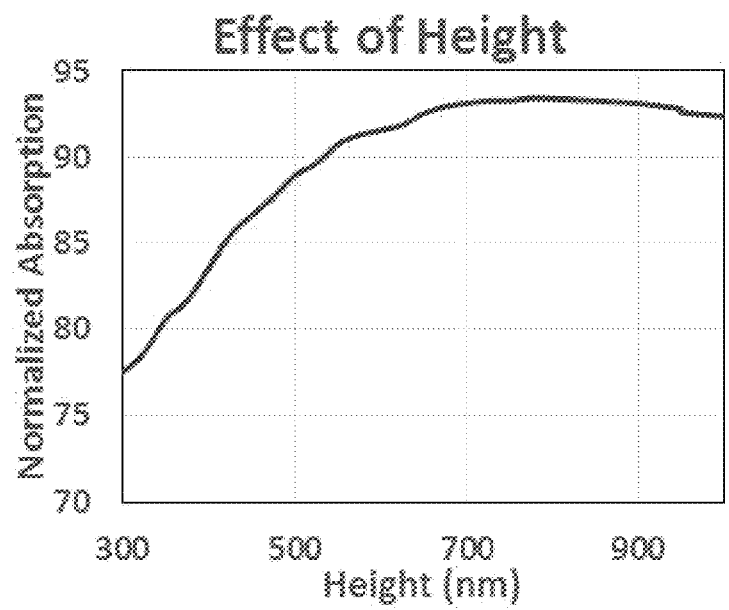

FIG. 11A shows the absorption distribution under AM1.5 radiation (1 kW/m²) with variation of height and base of the quintic shaped structures. In an exemplary embodiment of the invention, as shown in FIG. 11A, the absorption distribution is obtained for the quintic shaped structures forming on to the 8 micrometer thick c-Si. As depicted, the results show that maximum absorption under solar irradiance is obtained for a quintic structure having a square base of 450 nm length and a height of 775 nm. The variation of height and base width of the nano-structure also affects the optical characteristics of the photovoltaic cell. The optical characteristics include but not limited to, the reflection loss and transmission loss According to this invention, as the thinner base material (i.e. substrate material) is used, the radiation not absorbed by the material (either quintic shaped structure and/or combination of quintic shaped structure and base material) comes out from the structure as transmission loss. According to this invention, the reflection loss occurs due to the reflection of radiation (light) from surfaces, while the radiation passes through the transmission media having different refractive indexes. Using of quintic-shaped structure, the reflection loss can be made to minimal or completely close to zero for the specific bands of radiations. According to this invention, in an exemplary embodiment of the invention and in way of an example not way of limitation, FIG. 11A and FIG. 11B shows the effect of the height and length of the square base of the quintic-shaped structure on the absorption. In an exemplary embodiment of the invention as depicted from FIG. 11A, the absorption of more than 95% is obtained for the quintic shaped structures having square bases of 400 nm to 550 nm, and the heights of 600 nm to 950 nm. The absorption of more than 90% is obtained for the quintic shaped structure having square base lengths ranging from 375 nm to 700 nm, and the heights of 600 nm to 1200 nm. Alternatively, for quintic shaped like structure, as defined earlier, similar results (not shown here) are also achieved.

Figure 11C:
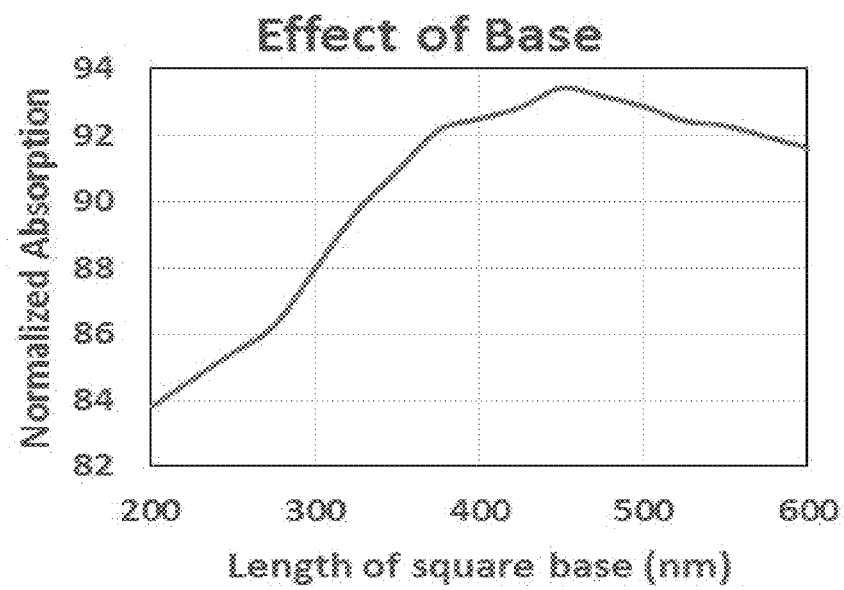

In an exemplary embodiment of this invention, as depicted from FIG. 11B, the absorption increases with increasing of the height of the quintic structures up to a certain height and beyond of that height the absorption starts to decrease. With proper selection of the length of square base of the quintic structure, and further optimization, the absorption (not shown here) can be increased to more than 99% even selecting very thinner Si below 50 micrometer. In addition, in another exemplary embodiment of the invention as shown in FIG. 11C, the optimum absorption is achieved for the square base length of 450 nm for the structure used.

Figure 11D:
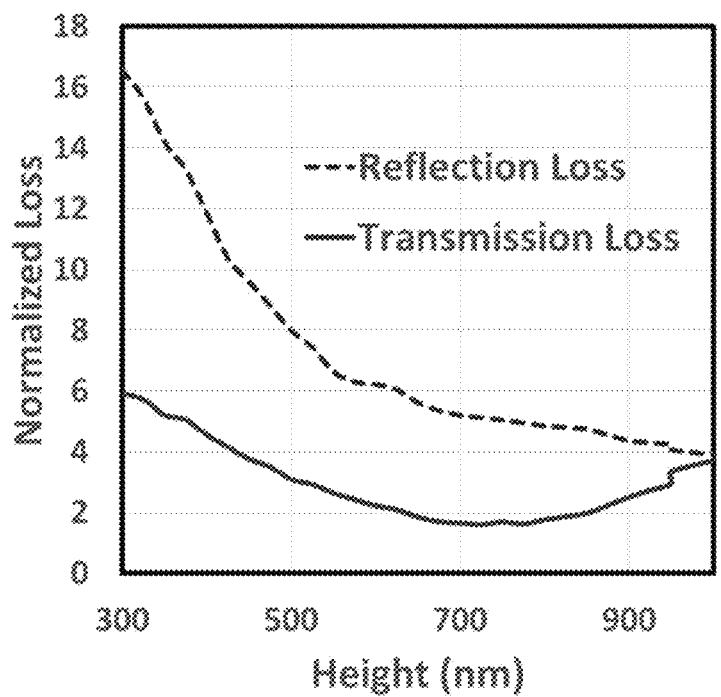
FIGS. 11D and 11E show the effect of height and length of the square base of the quintic structure on reflection and transmission losses, respectively.
Figure 11E:
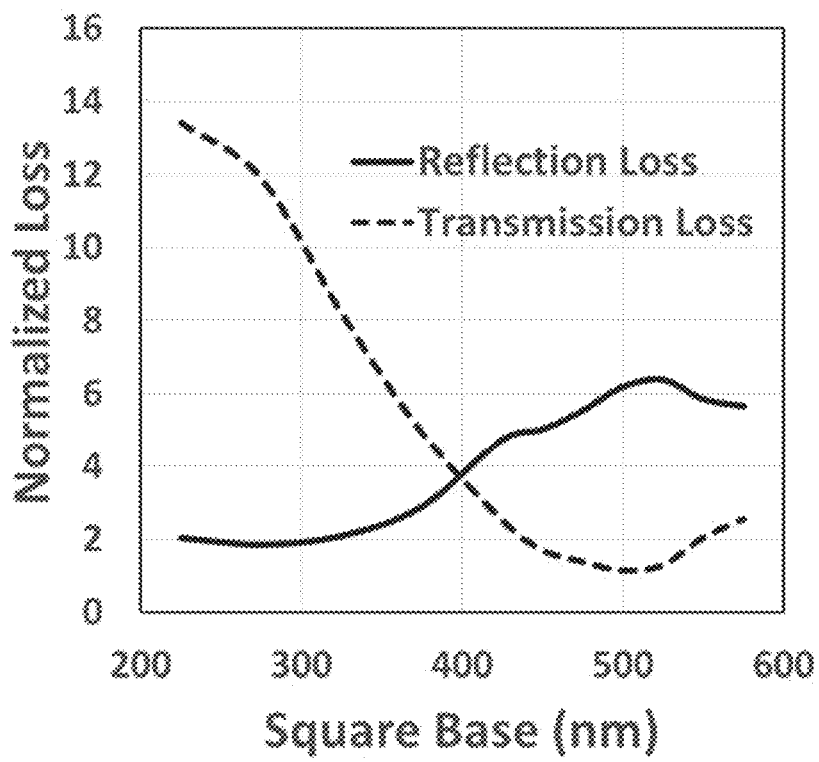

The optical loss in photovoltaic cells includes reflection and transmission losses. It is important to understand the variation of losses with variation in design parameters. In an exemplary embodiment of the invention, in way of an example not way of limitation, FIG. 11D and FIG. 11E show the effect of height and length of the square base of the quintic structure on reflection and transmission losses. Corresponding absorptions are shown in FIG. 11D and FIG. 11E, respectively. FIG. 11D shows that the reflection loss decreases with increasing height for a 450 nm square base. With increasing height of the nanostructure, the variation in effective index is slower from the top of the structure to the bottom. Because of smaller changes in the effective index as seen by light, the reflection loss decreases with increase in height. In the case of transmission loss as depicted from FIG. 11D, it initially decreases with increasing height, but after a certain point it increases. The variation in transmission loss can be explained by the light trapping effect provided by the nanostructure. For a given base width, at a smaller height of the nanostructure, the light trapping effect is less pronounced. As the height of the nanostructure is increased, the light trapping effect attains a maximum value after which it starts to fall, giving the transmission loss characteristics as seen in FIG. 11D. For a constant height of quintic structure on a photovoltaic cell, the reflection loss increases with increase in length of the square base as seen in FIG. 11E. This is because of the quick changes in the effective indexes from the top of the structure to the bottom as the width of quintic structure is increased for constant height. The transmission loss decreases with increase in width of the square base; it attains a minimum value and starts to increase again. This behavior can also be explained by the light trapping effects as discussed earlier.

Figure 11F:
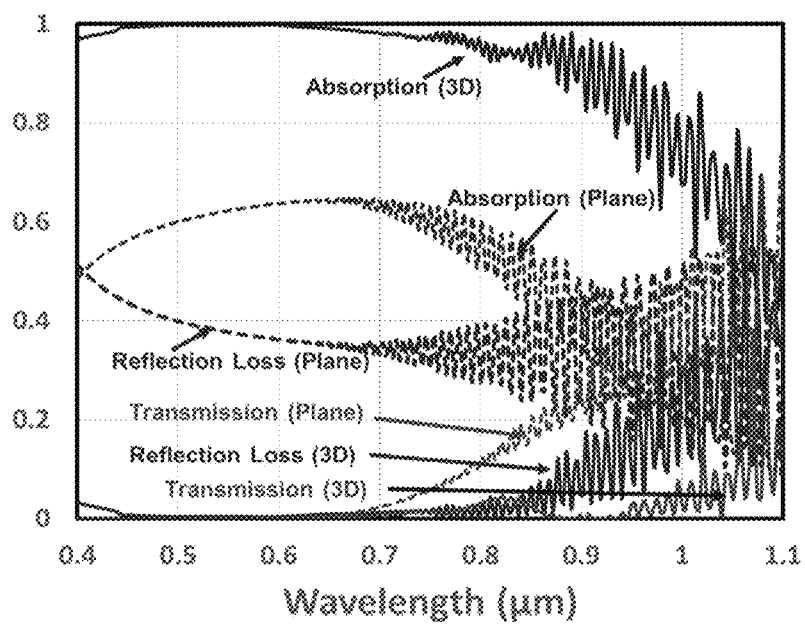
FIG. 11F shows the absorption, transmission loss, and reflection loss of the device structure comprising of a 3D structure (in this case Quintic shaped structure) in the preferred embodiment, FIGS. 11G, 11H, and III shows the results of current vs. Voltage, Current vs. Power, and Mass vs. Power, respectively for the plane Si solar cell and Quintic structure based solar cell.

According to this invention, in an exemplary embodiment of the invention, in way of an example not way of limitation, FIG. 11F compares the absorption, transmission loss, and reflection loss of the device structure comprising of a 3D structure (in this case quintic shaped structure) and the plane structure, specifically for the height of 775 nm and square base of width 450 nm for the quintic structure, selected from the results as shown in FIGS. 11A to 11E, and 8 micrometer of thickness silicon for plane structure, in the preferred embodiment. The results are achieved using optimized solar cell with quintic structure of height 775 nm and base 450 nm on top of 8 µm thick silicon. The thickness of plane structure selected is the same as that of height of the quintic structure, in addition to 8 µm as total thickness. As depicted in FIG. 11F, a significant reduction in reflection and transmission losses are observed accompanied by improvement in absorption. The reflection loss was reduced from 37.13% for plane silicon to 4.93% for the optimized structure, which is equivalent to an 84.9% reduction in reflection loss. In terms of normalized absorption, the optimized structure absorbed 93.44% of available spectrum compared to 53.56% of the plane silicon structure, which is equivalent to a 74.45% improvement in absorption. With further optimization, the absorption can be made to more increased with further decreasing the reflection and also the transmission loss. As depicted from FIG. 11F, using of quintic structure (mentioned as 3D in FIG. 11F), the reflection loss and transmission loss as well, can be completely eliminated or reduced to below 2% over wider ranges of solar spectrum wavelengths. The results are achieved using optimized solar cell with quintic structure of height 775 nm and base 450 nm on top of 8 m thick silicon, and for plane silicon solar cell with 8 µm thick silicon plus thickness of structures.

Figure 11G:
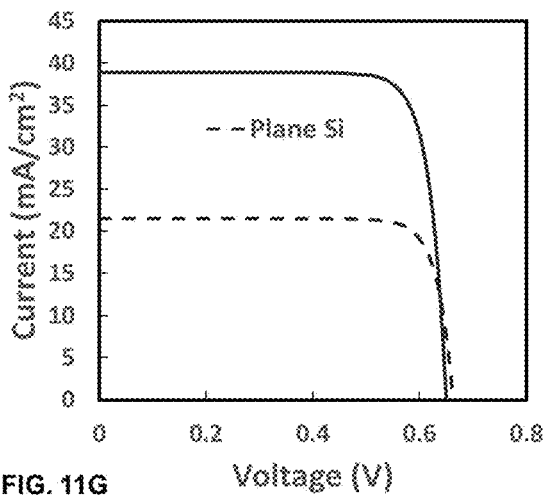
Figure 11H:
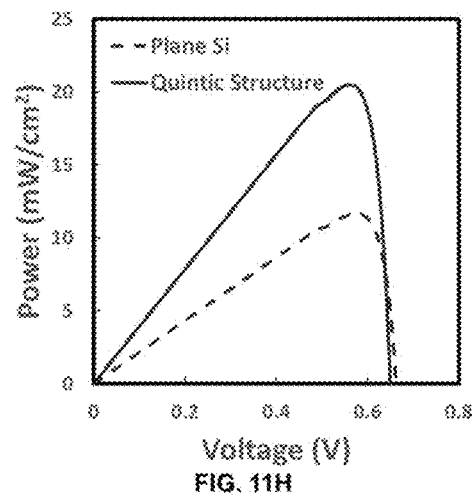
Figure 11I:
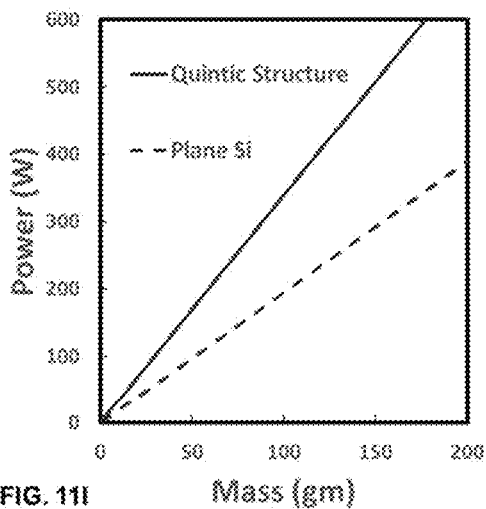

According to this invention, in an exemplary embodiment of the invention, in way of an example not way of limitation, FIGS. 11G, 11H, and 11I compares the results of Current-Density vs. Voltage, Power-Density vs. Voltage, and Mass vs. Power achieved using of cell based on quintic structures and the cell based on plane structure. The results are achieved using optimized solar cell with quintic structure of height 775 nm and base 450 nm on top of 8 µm thick silicon. A maximum current of 38.83 mA/cm$^2$ and a maximum power of 20.51 mW/cm$^2$ were obtained compared to 21.43 mA/cm$^2$ and 11.67 mW/cm$^2$ for plane silicon solar cell with 8 µm thick silicon. This corresponds to an 83.6% improvement in the efficiency of the solar cell compared to that of plane silicon. The power density of the solar cell was calculated to be 3.386 W/g compared to 1.94 W/g of plane silicon solar cell. With further optimization, the generation of current for the given area can be made to more increased with further decreasing the reflection and also the transmission losses.

The results showed in FIGS. 11G to 11I, are achieved due to use of the quintic structure. With increasing height of the nanostructure, the variation in effective index is slower from the top of the structure to the bottom. Because of smaller changes in the effective index as seen by light, the reflection loss decreases with increase in height (see FIG. 11D). In the case of transmission loss, it initially decreases with increasing height, but after a certain point it increases. The variation in transmission loss can be explained by the light trapping effect provided by the nanostructure. For a given base width, at a smaller height of the nanostructure, the light trapping effect is less pronounced. As the height of the nanostructure is increased, the light trapping effect attains a maximum value after which it starts to fall, giving the transmission loss characteristics as seen in FIG. 11D. For a constant height of quintic structure on a solar cell, the reflection loss increases with increase in length of the square base as seen in FIG. 11. This is because of the quick change of the effective index from the top of the structure to the bottom as the width of quintic structure is increased for constant height. The transmission loss decreases with increase in width of the square base; it attains a minimum value and starts to increase again. This behavior can also be explained by the light trapping effects as discussed earlier.

Figure 11J:
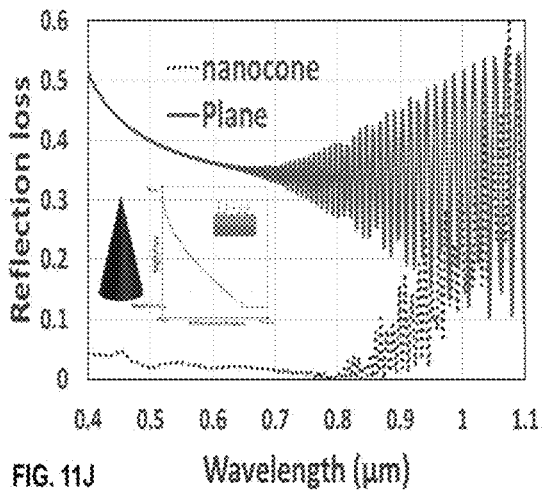
FIGS. 11J, 11K, and 11L are the results of reflections losses for the antireflections coating layer based on the nanocone, nanopillars, and quintic structures, respectively.
Figure 11K:
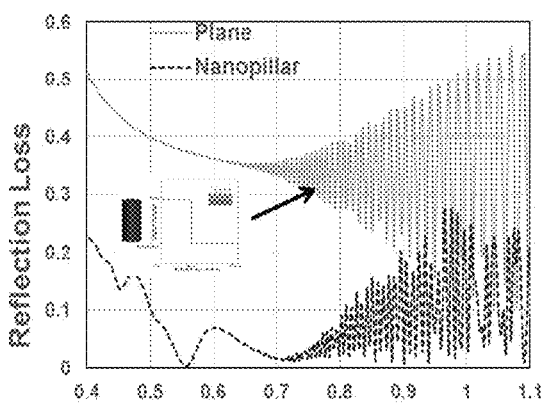
Figure 11L:
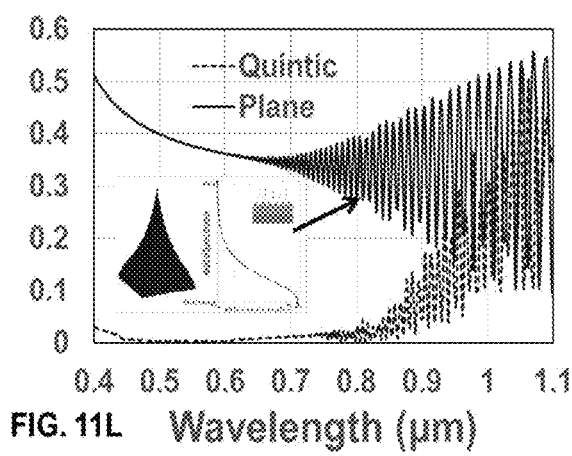

Alternatively, the 3D structure can also be used as the antireflection coating in optical devices including but not limited to detector, photovoltaic cell, and photoconductivity detector. The 3D structure includes but not limited to quintic structure, nanocone, nanopyramids, nanopillars, nano-trapezoidal pyramid or trapezoidal cone, or trapezoidal quintic structure. The antireflection coating materials to be used could be the electrical materials making the optical devices. Insulating material, electrical conductive material, or combination thereof. According to this invention, in an exemplary embodiment of the invention, in way of an example not way of limitation, FIGS. 11J, 11K, and 11L compares the absorption, transmission loss, and reflection loss of the device structure comprising of a 3D structure (in this case quintic shaped structure) and the plane structure, specifically for the height of 775 nm and square base of width 450 nm for the quintic structure, selected from the results as shown in FIGS. 11A to 11E, and 8 micrometer of thickness silicon for plane structure, in the preferred embodiment. In an exemplary embodiment, the 3D structures are made from Silicon as the electrical material part of the optical device (in this case solar cell). This structures can be used as the antireflection coating not only for the broad spectrum range but also as used for coating layer for omni directional illumination using of the vertical direction (3D structure orientation), or randomly oriented, or combination of thereof. With changing of material types, the antireflection coating and/or coating layer can be used for various optical bands.

In the preferred embodiment and also in an exemplary embodiment of the invention, in way of an example not way of limitation, the thinned silicon is considered to show the benefits of the structures to achieve reduced reflection loss in broad spectrum ranges, to make broadening the absorption and also to reduce transmission loss, even using of thinned material for potentially useful for the optical devices (i.e. photovoltaic cell). Furthermore, the radiation considered in the examples as shown in FIGS. 11A to 11F, are solar spectrum. Using of infrared (or UV) range material, the structure can also be used for reducing the reflection loss in desired broad spectrum ranges to enhance the optical performance of the device. According to this invention, with proper selection of material, its refractive index, and its physical parameters, the quintic structure (micro-nano scaled) can also be used as a broadband antireflection coating for an optical device (i.e. photovoltaic cell, detector) or use itself as the coating structure for the applications (not shown here) where reflection loss of radiation is to be minimized.

In the preferred embodiment and also in an exemplary embodiment of the invention, in way of an example not way of limitation, the square shape base is explained. This invention also cover all shapes of bases covering circle, elliptical, parabolic, or rectangular for the quintic structure and/or also quintic like structures. These structures can be arranged in periodically in array or randomly aligned. Furthermore, these structures can be arranged all in same heights or arranged in variable heights. Alternatively, each of the structure can be arranged side by side without gap, and/or each structure can be arranged with a gap which could be fixed or variable. Furthermore, the performance as shown in FIGS. 11A to 11L, even thinner Si of 8 micrometer thickness as base material with additional heights of the quintic structures, explained above can makes the high performance photovoltaic cell. Not only that, but also the flexible solar cell with high performance can also be achieved using the structure mentioned above. Alternatively, any thinned semiconductors or thinned material can be sued instead of Si.

Figure 12:
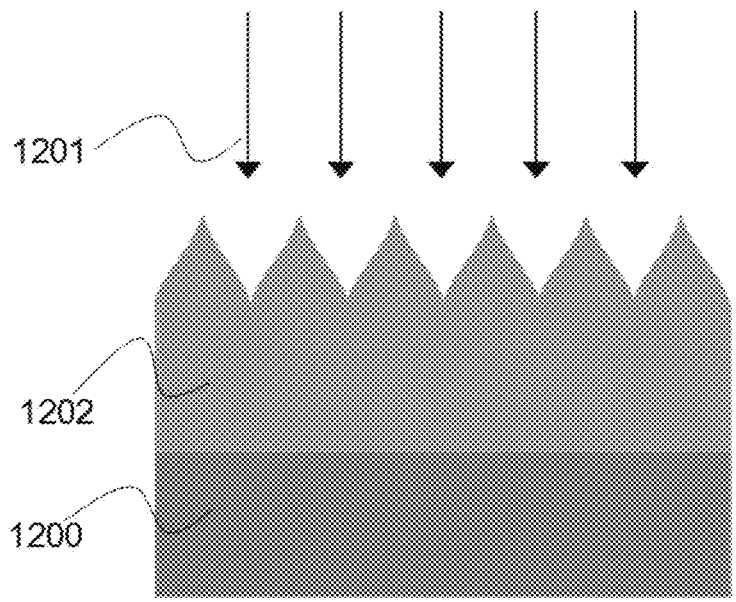
FIG. 12 is a schematic showing a cross sectional view of a device in the preferred embodiment according to the invention, The height and base length of the quintic nanopyramid structures may varies to achieve optimized the absorption, reflection, and transmission characteristics of a solar cell.

The photovoltaic cell in FIG. 12 is based on an ultra thin (less than 50 micrometer in thickness, even more less than 20 micrometer or 10 micrometer) semiconductor substrate or layer (i.e. Si), which uses curved nano-scaled surface on top of plane using wither made from other material or made from same or dissimilar semiconductor (i.e. Si) to reduce reflection and enhance light-trapping mechanism to increase absorption significantly, which results in increasing the conversion efficiency. In an exemplary embodiment of the invention, in way of an example not way of limitation, the photovoltaic cell comprises of quintic nanostructures shaped formed on or made out of substrate. As a substrate or thinned layer and also as an exemplary embodiment, thinned silicon substrate of thickness less than 50 micrometer (in this case 8 micrometer) is used, and as mentioned quintic structure is formed on or transferred from other substrate (not shown here), or etched out of silicon substrate. As the thinner substrate or layer is used, a polymer or glass of refractive index 1.56 is used as the base for the photovoltaic cell. The variation of shape of structures from top to bottom provides a gradual change of the effective refractive index from air to the plane of silicon substrate and thus reducing reflection losses. As an exemplary embodiment, in way of an example not way of limitation, the substrate if Silicon is used, however, the substrate can be any type semiconductor, semi insulator, dielectric, or conductive type material. The material type can be the same or dissimilar, if the structures are formed on the top of the substrate. In the case semiconductor substrate, the structures could be formed onto or etched out from the substrate can be the electrical material of one type (p or n) which allows to make the semiconductor junction with another type (n or p) electrical material. The quintic structures along with the substrate are the main part of the photovoltaic cell. FIG. 12 shows the cross sectional view of photovoltaic device structure wherein nano-structures as explained earlier are formed onto the substrate and/or formed out of the. The height and base width of the nano-pyramid may varies to have different effects and/or to achieve desired effects on the absorption, reflection and transmission characteristics of the solar cell.

According to a preferred embodiment of the present invention, illustrated in FIG. 13A, in way of an example not way of limitation, is photovoltaic cells comprising a plurality of nanoscaled(s) scaled quintic structures which are formed on a supporting substrate, wherein like parts are indicated by like or similar reference numerals as used in FIGS. 6 to 9 so that a repeated explanation is omitted here. The nanoscale quintic structures 1301 are electrical material, comprised of an electrical conduction of either p or n type semiconductor material. The quintic structures are formed on or etched out of a substrate 1300 comprising a semiconductor of the same type as the structures. Alternatively, the substrate may be made out of a semiconductor of the same type or opposite type, (not show here) with the quintic structures formed on top. The electric material 1302 dispose on to the quintic structures 1301, and surrounds the quintic structure and the electrical material 1302 comprises a semiconductor material of n or p type, which is opposite of the material used in the quintic structure forming a p-n junction 1308 along the top and side-walls of the quintic structure 1301. The electric material of the structures 1301 and the second electrical layer 1302 are electrically connected to electrodes: 1303*a* and 1303*b*. The electrodes are common and that serve for all of the structures. Electrode 1303*a* or 1303*b* can be transparent, not shown here, and can be formed on the electrical material 1302 or junction 1304, respectively. The electrodes 1303*a* or 1303*b* are disposed all over the surface (as Shown FIG. 13A) or connecting to the layer of interest (not shown here), which electrically connects whole layers 1300 or 1302 to form the p-n junction. More than one layer of the same type electrical material (not shown here) may require to make the perfect ohmic contacts Additionally, a passivation layer (not shown here) may be used to fill the gaps in between the structures formed after disposing the electrical layer 1302. The passivation layer may be disposed either after disposing the electrode 1303*b* or before disposing the electrode 1303*b*. If the passivation layer (not shown here) formed before the electrode 1303*b*, either planarization is necessary to open the electrical layer 1302 for contact or via is required followed by the making contact using electrode 1303*b*.

An exemplary embodiment, in way of an example not way of limitation, involves the using a Si based quintic structure of a square base of 450 nm and a height of 775 nm forming either on to the Si plane of thickness less than 50 micrometer thickness, or formed out of thinned Si, in order to achieve the maximum absorption over 97% of solar irradiance. Alternatively, the quintic structures may have a degree of variability resulting from manufacturing error or other unforeseen factors, leading to a preferred range of tolerances. The preferred range for height may fall from the maximized height is 675 nm to 890 nm with minimum loss, and may increase from 890 nm to 975 nm with minimal loss to absorption. Allowable variations of heights are ranging from 580 nm to 1200 nm to achieve more than 90% absorption under solar radiation. Not only that but also absorption spectra are also extended to near infrared 1000 with higher absorption of more than 35%. Furthermore, the preferred range for base may fall from the maximized base is 410 nm to 535 nm with minimum loss, and may increase from 535 nm to 600 nm with minimal loss to absorption. Allowable variations of bases are ranging from 350 nm to 750 nm to achieve more than 90% absorption under solar radiation at a given height selected from the ranges mentioned above.

According to a preferred embodiment of the present invention Illustrates in FIG. 13B, in way of an example not way of limitation, a photovoltaic cell comprises a plurality of nano-scaled or micro scaled quintic structures which are formed or etched from a supporting substrate, wherein like parts are indicated by like or similar reference numerals as used in FIG. 13A so that a repeated explanation is omitted here. FIG. 13B depicts the second electrode 1303*b* placed planar on top of the cell in contact with the second electrical layer 1302. The electrode 1303*b* may be any conductive material.

Figure 13:
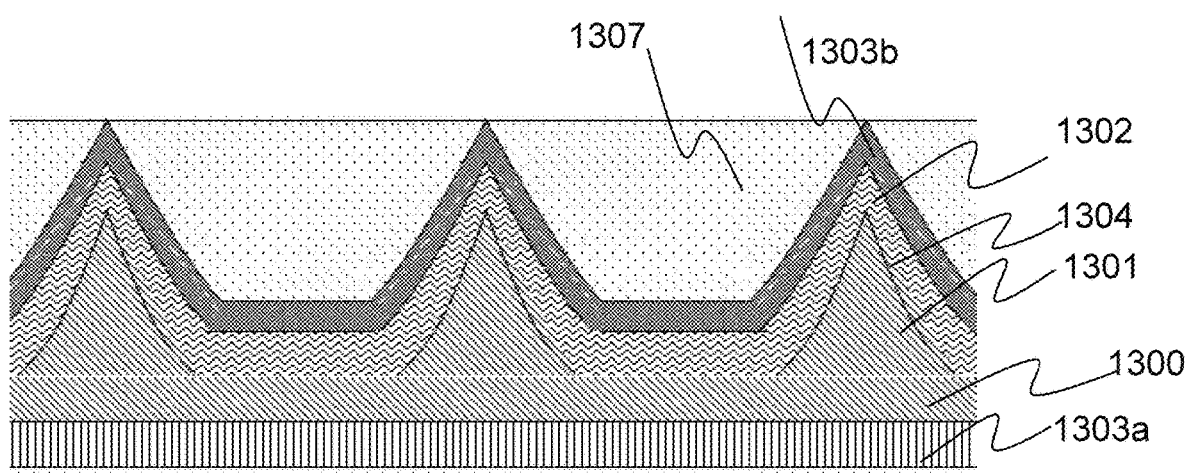
Figure 13:
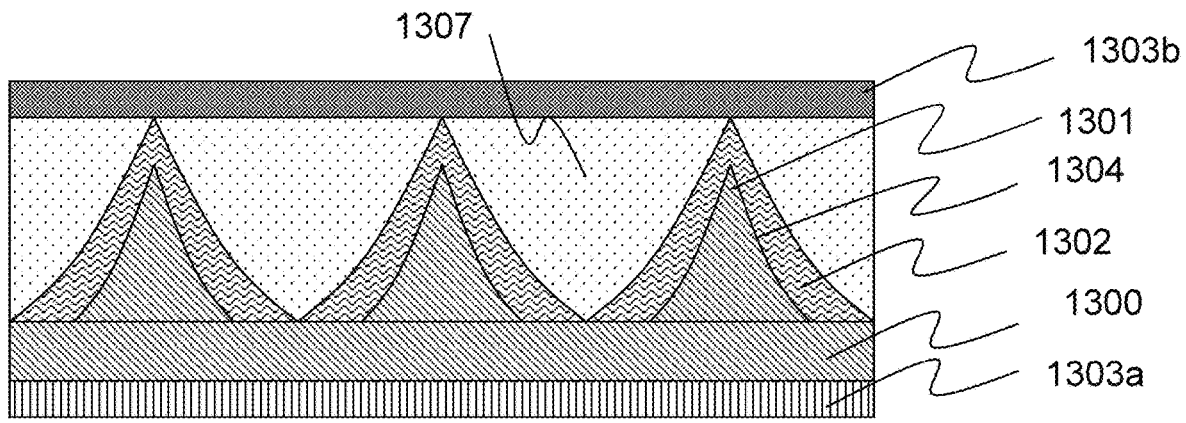
Figure 13C:
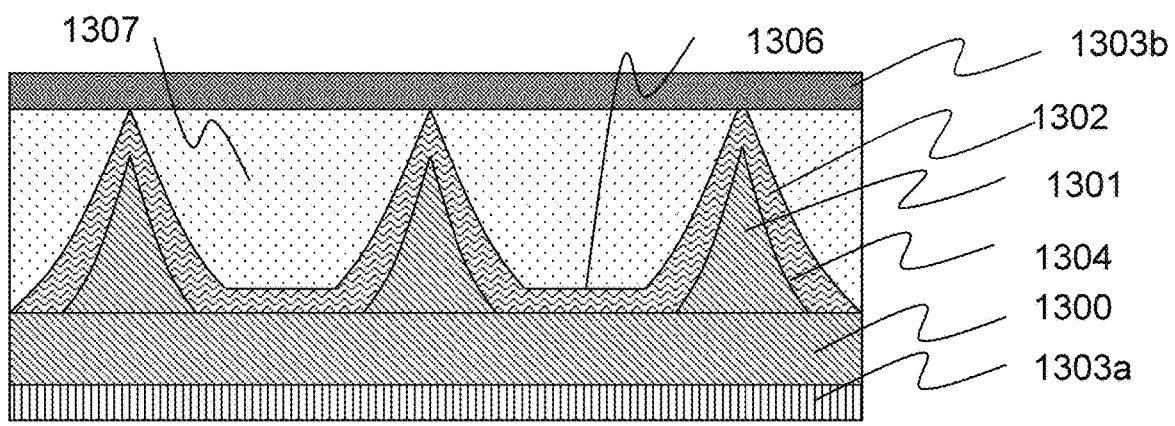

FIG. 13C is a cross sectional view of a photovoltaic cell in the preferred embodiment in accordance to this invention, wherein like parts are indicated by like or similar reference numerals as used in FIG. 13A and FIG. 13B, so that a repeated explanation is omitted here. According to this invention, in way of an example not way of limitation, the quintic structures may be located in proximity to each other such that they form gaps 1306. In the preferred embodiment, the light, not absorbed by the side wall of structures are get reflecting back and forth and are focused and get absorbed at the gap and/or reflected back the light which are not absorbed. Using of this structure helps to reduce the use of the amount of semiconductor material used to form p-n junctions, and yet to achieve higher conversion efficiency to at least to achieve similar conversion efficiency at reduced material used. This results in overall reducing the cost of the photovoltaic cell.

Alternatively, in way of an example not way of limitation, the substrate 1300 may be formed out of an insulating material, semi-insulating material, or an electrically conductive material. When an insulating material is used as the substrate 1300, a layer of electrically conductive material will need to be disposed on to the insulating substrate to be used as an electrode, before disposing electrical materials (i.e semiconductor) to form a pn junction of 1308 (not shown here). Semiconductor material also may be used as a substrate; however the pn junction is formed all over the 3-D structures and also on the gaps if the second layer is applied continuously over the surface of the substrate and quintic structures. Preferably the configuration may allow for an electrical material (i.e. 1302) to be placed in the gaps 1306, allowing a semiconductor substrate 1300, and quintic structures 1301 of a first electrical material type, and a continuous coating of a second type of electrical material 1302. This allows for a pn junction 1308 to be formed along the entire surface of the cell. This is depicted in FIG. 13C which allows light, not absorbed from the structures 1301 after reflected back and forth and trapped and are get absorbed into the gaps 1306 and granting the solar cell a greater efficiency. As electrical material either a substrate and/or quintic structures may be comprised of, or are coated by a material including but not limited to, Si, Ge, InP, GaAs, GaP, Cds, CIGS, CdSe, CdTe, ZnO, ZnSe, ZnS, or polymer or metal etc., or combinations thereof, separately synthesized either by epitaxial growth in a vacuum deposition system and/or chemically formed from the solution.

Figure 13D:
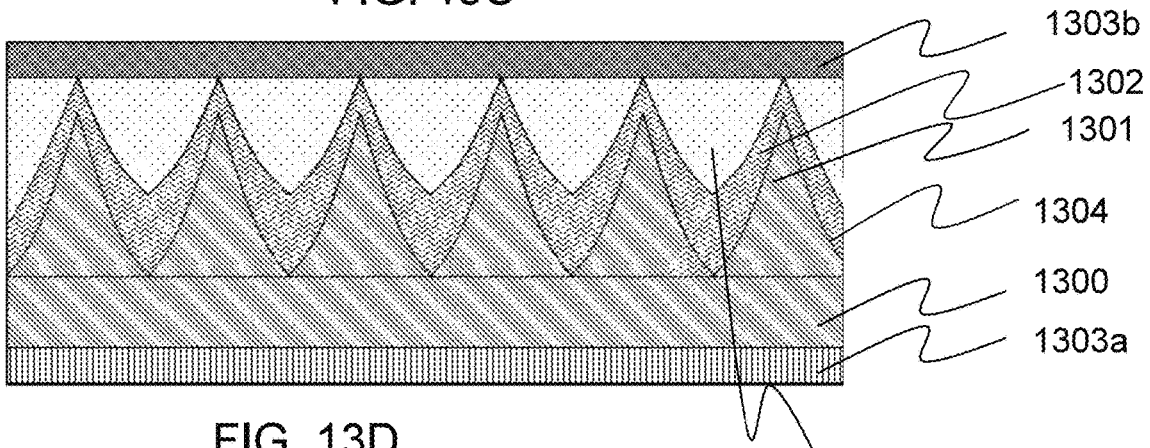

Alternatively, an exemplary embodiment, in way of an example not way of limitation, as depicted in FIG. 13D, includes the quintic structures 1301 being in proximity to one another, or conjoined to each other. In this embodiment, there are no gaps between the structures, but instead the slop of second electrical material 1302 runs directly into the slope of the next structure. This promotes light reflecting between the structures which increases absorption. This configuration has the quintic structures 1301 are in contact with each other. Alternatively, there may be a gap between the quintic structures, while still being conjoined by the electric material 1302.

Figure 13E:
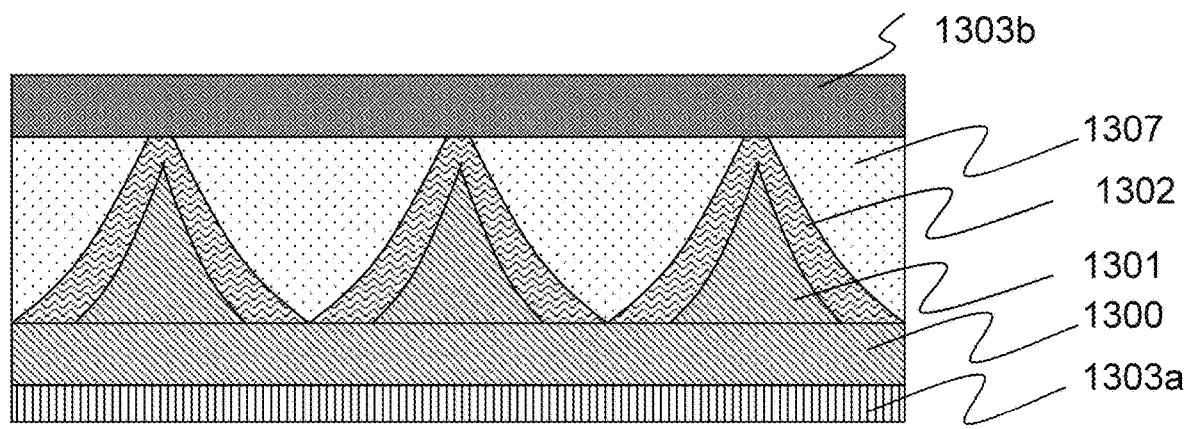
Figure 13:
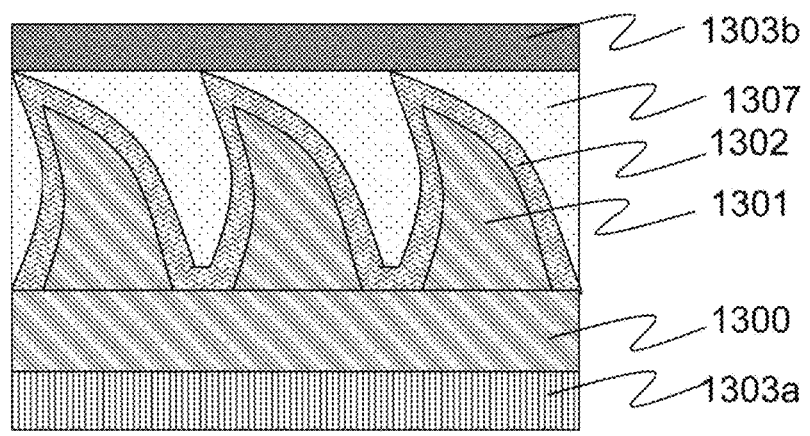

FIG. 13E is the schematic showing a cross-sectional view of photovoltaic cell in accordance to this invention, wherein the same numerals are the same parts as explained in FIG. 13A, FIG. 13B, FIG. 13C and FIG. 13D, so that repeated explanation is omitted here. According to this invention as depicted in FIG. 13E, in way of an example not way of limitation, the quintic structures may be truncated or not truncated and may have a passivation material between the second electric material and the second electrode material.

FIG. 13E depicts the quintic structure formed from first electrical material 1301 is originally having spacing between the structures, however by disposing of the second electrical material 1302 onto the first electrical material 1301 form the structures without a gap between the structures. Furthermore, the structure depicts an example of a truncated quintic structure, wherein the second electrical material 1302 layer has a flat top surface but the first electrical material 1301 does not have truncated top, but top point. Furthermore, this structure must avoid having the first electrode layer 1303a electrically shorting the second electrode 1303b. Additionally, a passivation material 1307 is used in-between the second electric material 1302 and the second electrode 1303b such that it fills the gaps between the structures. Alternatively, both the first and the second electric materials may be truncated, by making the first electric material have a flat top portion, and/or the second electric material is conformally applied the first (not shown here).

The electrical materials as described in FIG. 13A, FIG. 13B, FIG. 13C, FIG. 13D, and FIG. 13E forming p-n junctions are semiconductor materials of amorphous, microcrystalline, crystalline, or their combination types materials and may be a single semiconductor type material and/or multiple semiconductor type materials selected from a group consisting of Si, Ge, GaAs, GaSb, GaN, InP, GaP, CdTe, ZnO, CIGS, polymer or combinations of thereof.

FIG. 13F is the schematic showing a cross-sectional view of photovoltaic cell in accordance to this invention, wherein the same numerals are the same parts as explained in FIG. 13A, FIG. 13B, FIG. 13C, FIG. 13 D and FIG. 13E so that repeated explanation is omitted here. According to this invention as depicted in FIG. 13F the quintic structures 1301 are formed at an angle, and not perpendicular to the substrate 1300. The angled quintic structures may be aligned periodically, or aliened randomly such that the angles are either aligned in specific ordered directions or randomly selected directions. The structures may be spaced or conjoined as shown in FIG. 13A, FIG. 13B, FIG. 13C, FIG. 13D, and FIG. 13E as to allow for reflection between the structures or into gaps between the structures. Furthermore, the heights of the structures may vary in height, and base width of the structure (not shown here)

Figure 14A:
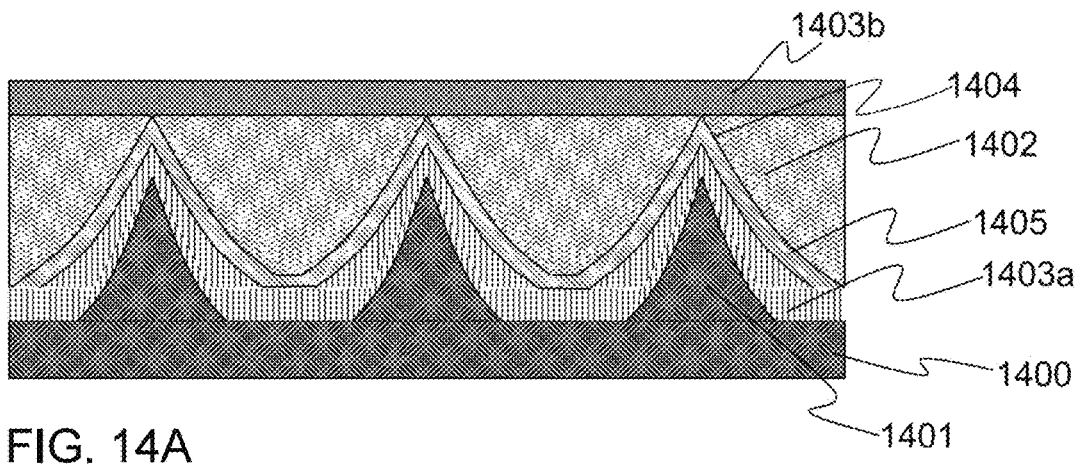

FIG. 14A is a cross sectional view of a photovoltaic cell in the preferred embodiment in accordance to this invention, wherein like parts are indicated by like or similar reference numerals as used in FIGS. 13A to 13F, so that a repeated explanation is omitted here. According to this invention, in way of an example not way of limitation, the nano-scaled quintic structures 1401 according to FIG. 14A may be formed on a substrate 1400 that is dielectric, insulating, conductive, polymer, or non-electrically conductive and the electrode 4103a is formed on the top of the substrate and structures. The electrode 1403a acts as a common electrode for all of the structures. A first electric material 1405 of either n or p type disposed, placed or formed on top of the electrode 1403a. A second electric material 1402 is then disposed, formed or placed on top of the first electric material 1405 on type opposite the first electric material 1405 in order to form a pn- or Schottky junctions where built-in potential for both electrons and holes are generated. The second electric material 1402 may either fill the reminder of the space between the quintic structure, as shown in FIG. 14A or coat the first electric layer 1405 (not shown here). A second electrode 1403b is placed on top of the second electric layer 1402. The second electrode 1403b may be a planner, or may be conformably applied to the second electric layer 1402 (not shown). Furthermore, when the second electrode 1403b is planer, then a passivation material may be used to fill the space between the second electric material 1402 and the second electrode 1403a. Alternatively, the second electric material 1402 may be conformally applied onto of the first electric layer 1405. Then the space between the second electric material 1402 and the second electrode 1403b may be filled with a third electrical material or second electric material 1402 with higher doping concentration. More than one layer to make pn junction and/or ohmic contacts may require.

The electrical material in FIG. 14A forming the p-n junction or Schottky junction are semiconductor materials may consist of semiconductors such as Si, Ge, GaAs, GaN, InP, GaP, GaSb, CGIS, CdTe, or ZnO or polymer or metal or a combination of thereof.

Figure 14B:
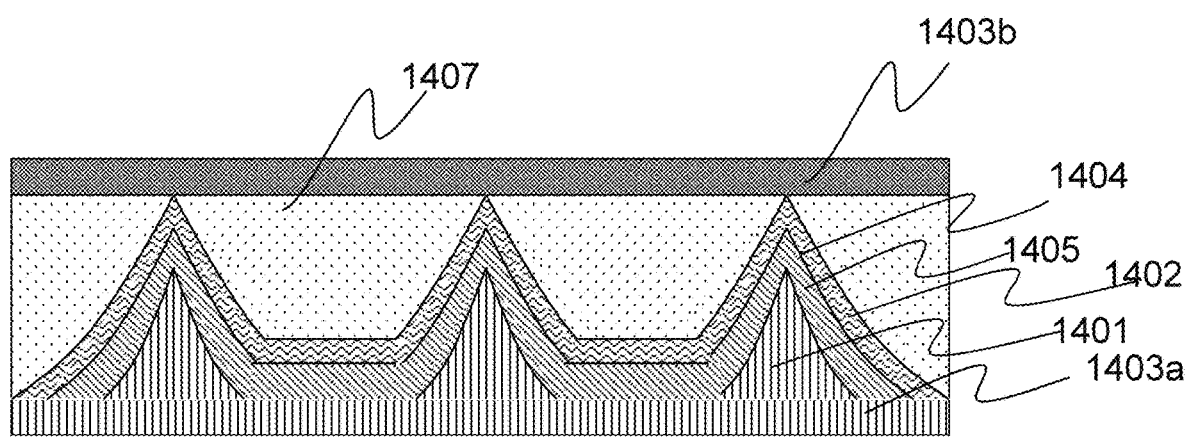

Alternatively, according to this invention, in way of an example not way of limitation, the nano-scaled quintic structures may be formed on a substrate comprising an electrically conductive material or electric type material. FIG. 14B is the schematic showing a cross-sectional view of photovoltaic cell according to this invention, wherein the same or like numerals are the same parts as explained in FIG. 14A, so that repeated explanation is omitted here. In FIG. 14B the substrate used is an electrically conductive material 1403a and have quintic structures 1401 formed on it, or etched out of it, and acts as a common electrode to all of the structures. The quintic structures 1401 may be either conjoined (not shown), separated by gaps (not shown), or placed directly next to each other. FIG. 14B shows an embodiment wherein the quintic structures are located in direct contact with each other. A first electric material 1405 of either p or n type is disposed, formed, or placed onto the quintic structures and in gaps if the configuration has gap between the structures. A second electric material 1402 is formed on top of the first electric material 1405, and is an electric material of opposite type than the first electric material, creating a p-n junction 1404 or creating a Schottky junction. A passivation material 1407 is then disposed, applied, or placed on to the structures which levels or planarize the surface of the cell, and a second electrode 1403b is then disposed, or applied to the structure which acts as a common electrode to all of the structures. Furthermore, the quintic structures 1401 can be made of a specific height, or at random heights. Furthermore, they can be arranged periodically spatially or randomly. In addition, the quintic structures can have orientation in different angles with respect to the substrate surface.

According to this invention, in way of an example not way of limitation, alternatively the micrometer(s) or nanometer(s)-scaled quintic structures can be formed on utilizing the semiconductor substrate, and the electrode can be formed on back side of the substrate to have common contact for each micrometer(s) or nanometer(s)-scaled quintic structures, necessary for creating wide surface area. In way of an example not way of limitation, the nanometer(s) or micrometer(s)-scaled quintic structures can be made of p type or n-type semiconductor substrate and the thin film material that on or surrounds the micrometer(s) nanometer(s)-scaled quintic structures can be made of the opposite type of semiconductor.

Alternatively, the structures described in FIG. 14A and FIG. 14B may have gaps between the structures as described in FIG. 13B or may have conjoined to each other such in FIG. 13C. Furthermore, the quintic structures described in FIG. 14A and FIG. 14B may be truncated as in FIG. 13D, or may be truncated by having the internal layers of the structure become flat and have the other layers conformally applied the structures. Alternative embodiments of the present invention may also include the use of alternative shapes for the base of the quintic structure, including but not limited to a triangular, a circular, trapezoidal, and hexagon shaped bases.

According to this invention, in way of an example not way of limitation, alternately micrometer or nanometer quintic structures may be formed on the bottom surface of the cell. Because these structures are formed on the bottom surface of the cells the structures reflect light that has passed through unabsorbed. The reflected light then passed upward through the cell allowing for a more light (or radiation) to be absorbed through the cell. This embodiment will require the electrodes and the semiconductors located on top to be transparent to the wavelengths of light that is meant to be reflected back into the cell. The quintic structures located on the bottom surfaces act as traps to trap and reflect light back toward the surface. Furthermore, the structures are located such that there are no gaps between the structures in order to reflect light back toward the surface of the cell.

According to this invention, in way of an example not way of limitation, the quintic structures taught above in FIGS. 13A to 13E, and FIG. 14A and FIG. 14B may also be applied to embodiments where a 2-dimensional array of the structures, extends the length he length of the photovoltaic cell. Variations from the square base to a continuous shape, friendly to manufacturing across the length of the photovoltaic cell will cause more tolerance and less complexities to manufacture.

According to this invention, in way of an example not way of limitation, the quintic structures (1301, 1401) may be of uniform height or varied heights, as well as uniform or varied size of base and or uniform or varied distance between the center point of the bases, or a combination thereof. Furthermore, the base of the structures may be on the same plane or each structure may be at different elevations and or heights.

Furthermore, the quintic shaped structures, regardless of the shape of the base or whether they are truncated or combed to a point, may also be at an angle, and not perpendicular to the plane of the substrate.

Figure 15:
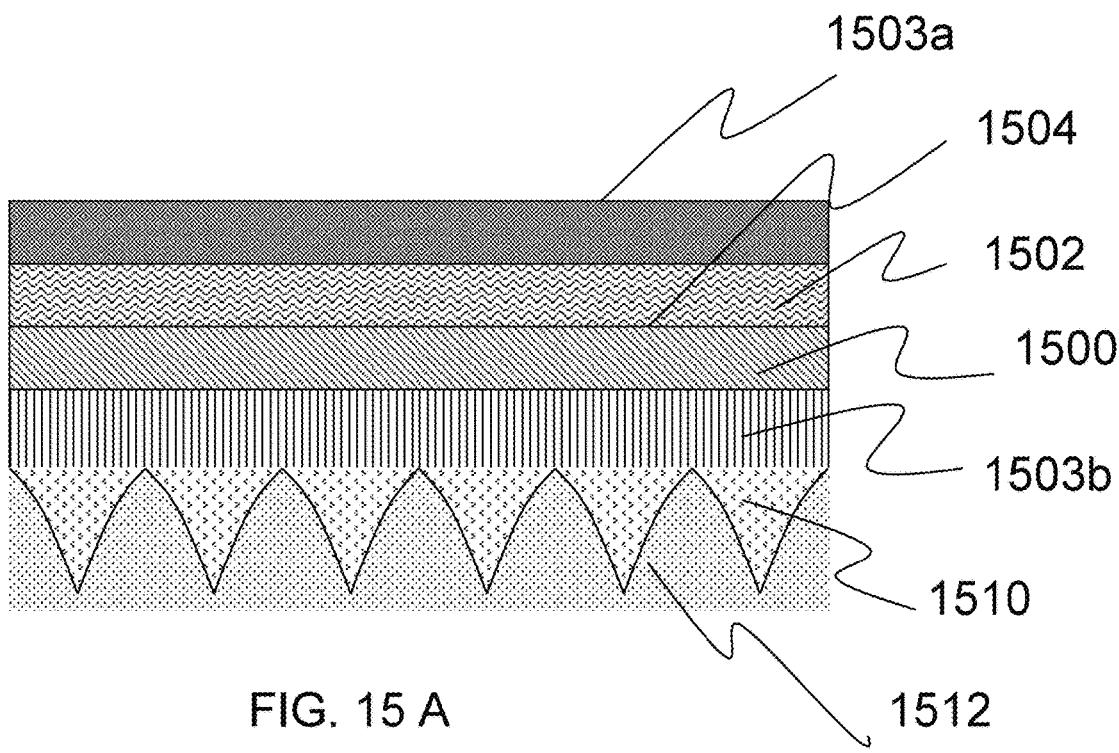
Figure 15:
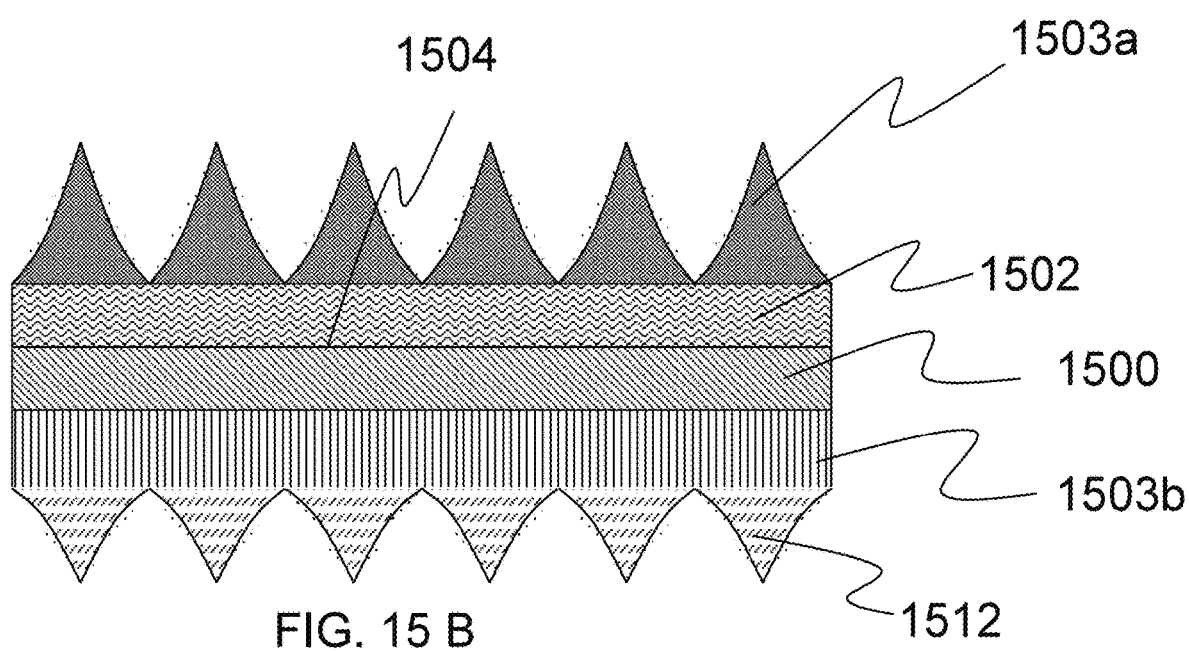

Alternatively, according to this invention, in way of an example not way of limitation, micro-nano scaled quintic structures may be used as a trap structure to trap the lights and/or reduce the reflection, and/or make the highly reflective. FIG. 15A is the schematic showing a cross-sectional view of photovoltaic cell according to this invention, wherein the same or like numerals are the same parts as explained in FIGS. 13A to 13F and FIG. 14A and FIG. 14B, so that repeated explanation is omitted here. The trap or reflective structure 1510 in a quintic shape etched from a reflective or other suitable material 1512. The structure can be made under a conventional photovoltaic cell having a first electric material 1500 of p type or n type, a second electric material 1502 of the opposite type as the first, and an electrode 1503b is located either top of the trap structures or bottom of the trap structure. The trap or reflective structure 1510 may be an empty space, etched from the reflective material, or filled with a material that is transparent to the wavelength and trap structure reflects the light back that is being reflected in the trap structure. The quintic structure acts as an effective traps structures when light comes from the base side of the structure. The quintic structure will scatter or reflect back the light into the junction 1504. The junction as shown is flat; however the trap structure may be applied to the embodiments shown in FIGS. 13A to 13E and FIGS. 14A and 14B. The electrode 1503b is a transparent electrode which allows light to the wavelength harvested by the photovoltaic cell to pass through into the trap structure. The trap-structure can be formed from the same material as electrode material or dissimilar material.

FIG. 15B is the schematic showing a cross-sectional view of a photovoltaic cell according to this invention, wherein the same or like numerals are the same parts as explained in FIG. 15A, so that repeated explanation is omitted here. According to the preferred embodiment, in way of an example not way of limitation, FIG. 15B depicts a photovoltaic cell wherein there are two trap structures, one located in front of a photovoltaic cell in the path a incoming light to trap and eliminate the surface reflection, and act as the antireflection structures and increasing the absorption, and second one is located at the bottom side of the photovoltaic cell, located either before the electrode or after the electrode. The first quintic structure 1512 is etched out of the electrode 1503a which is comprised out of a conductive transparent electrical material. The quintic structures 1512 may be etched partially or wholly into the electrode 1503a in order to act as a trap structure for reflected light coming from inside of the photovoltaic cell and allowing to return to the electric materials 1500 and 1502. The first electric material 1500 and second electric material 1502 are shown to be flat but may be shaped as the structures described above. The second trap structure underlay the cell and acting as highly reflective structure which scatters and reflects light back into the cell. Unlike the trap structure depicted in FIG. 15A the present trap structure is made out of a highly reflective coating rather than an air gap etched from another material. Alternatively, the antireflective layer can be made from a nonconductive transparent material, and the top electrode 1503a will be made out of conductive transparent material which can be flat and can be under laid or located below the antireflective layer (not shown).

Figure 15C:
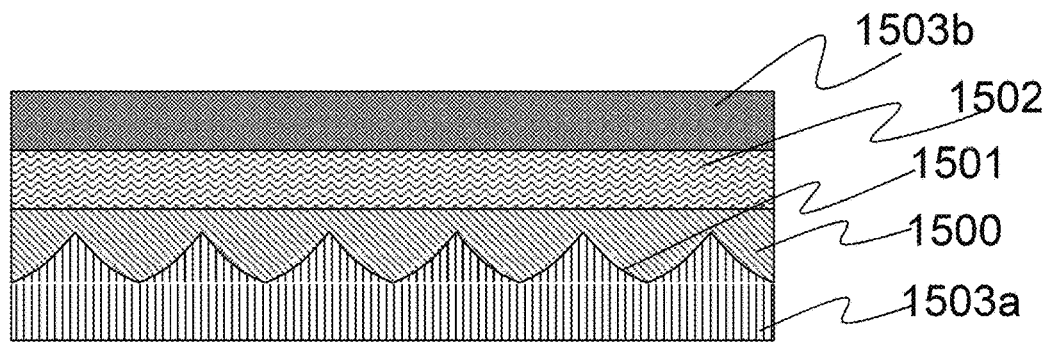

FIG. 15C is a cross sectional view of a photovoltaic cell in the preferred embodiment in accordance to this invention, wherein like parts are indicated by like or similar reference numerals as used in FIGS. 15A and B, so that a repeated explanation is omitted here. FIG. 15C depicts a preferred embodiment, in way of an example not way of limitation, where the quintic structure 1501 is formed from or on the first electrode 1503b and acts as a reflective layer scattering light in the structure pn junction.

Figure 16A:
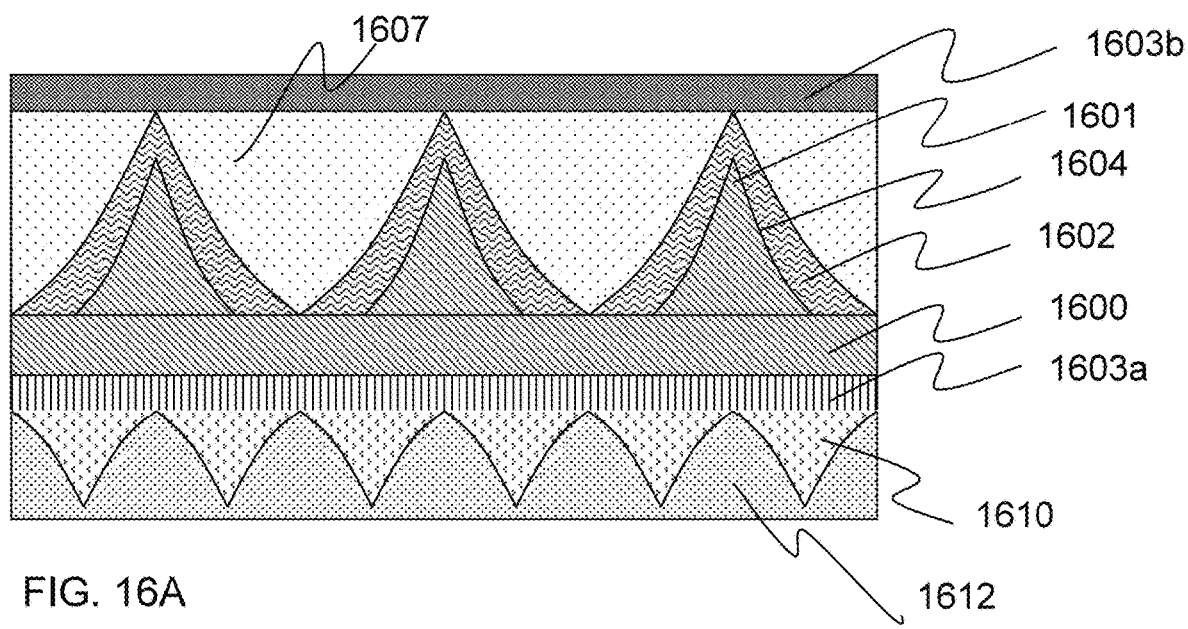
FIGS. 16A and 16B are the cross-sectional views of photovoltaic cell structure comprising with a quintic shaped structure and a reflecting structure located at the bottom.

According to this invention, in way of an example not way of limitation, the tap structure as depicted in FIGS. 15A and 15B may be used on the embodiments depicted in FIGS. 13A, 13B, 13C, 13D, 13E 14A and 14B. FIG. 16A depicts an example of the trap structure used in FIG. 15B on an embossment of FIG. 13A. However, the trap structures may be used in all of the embodiments taught in FIGS. 13A through 13F, and 14 A, and 14B.

According to this invention, in way of an example not way of limitation, in FIG. 16A, the nanoscale quintic structures 1601 are electric material, comprised of an electrical conduction of either p or n type semiconductor material, and can be treated as first electric material. The quintic structures are formed on or etched out of a substrate 1600 comprising a semiconductor of the same type as the structures. Alternatively, the substrate may be made out of a semiconductor of the same type or opposite type, (not show here) with the quintic structures formed on top. The second electric material 1602 dispose on to the quintic structures 1601, and surrounds the quintic structure 1601 and the second electric material 1602 comprises a semiconductor material of n or p type, which is opposite of the material used in the quintic structure 1601 forming a p-n junction 1604 along the top and side-walls of the quintic structure 1601. The electric material of the structures 1601 and the second electric material 1602 are electrically connected to electrodes: 1603a and 1603b. The electrodes can be common and that serve for all of the structures. Electrode 1603a or 1603b can be transparent, not shown here, and can be formed on the electric material 1602 or junction 1604, respectively. Additionally, a passivation layer may be used to fill the gaps in between the structures formed after disposing the electric material 1602. The passivation layer may be disposed either after disposing the electrode 1603b or before disposing the electrode 1603b. If the passivation layer (not shown here) formed before the electrode 1603b, either planarization is necessary to open the second electric material 1602 for contact or via is required followed by the making contact using electrode 1603b. The passivation layer 1607 may be an insulter, second electric material 1602 or a transparent layer.

Figure 16B:
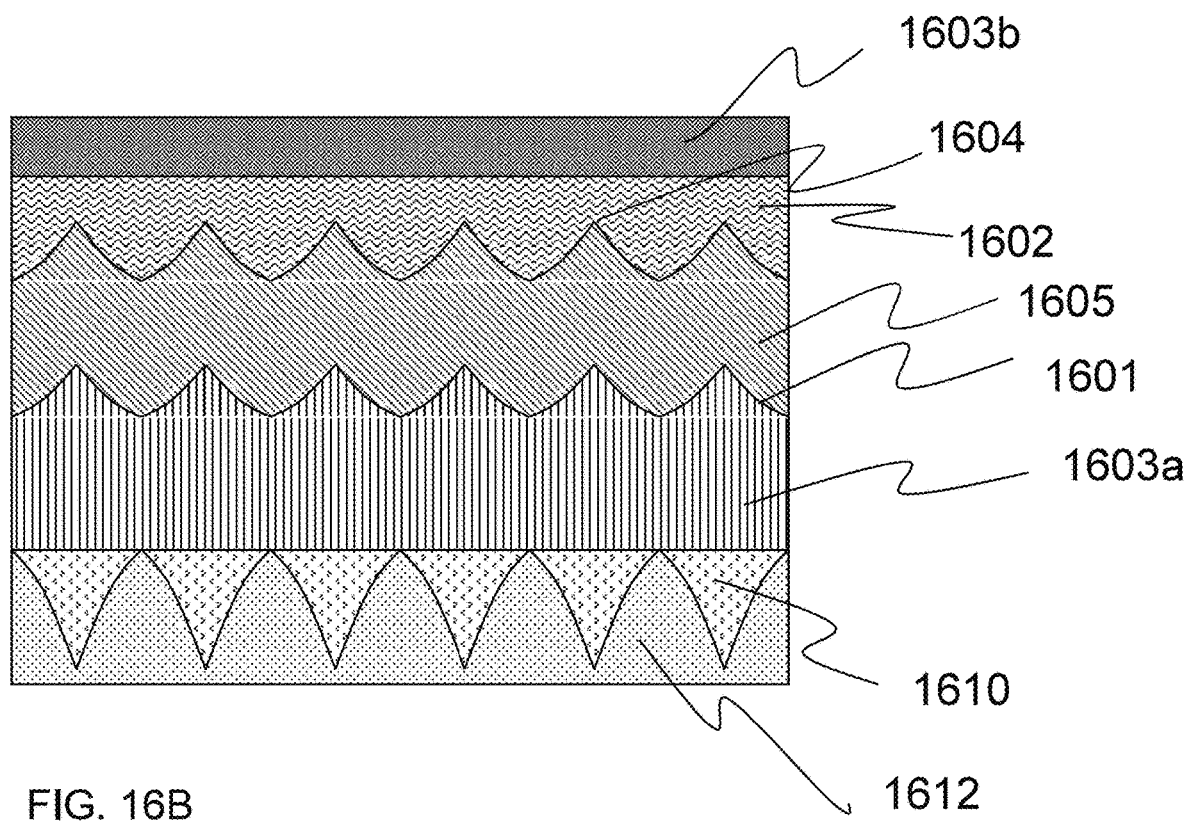

FIG. 16B is a cross sectional view of a photovoltaic cell in the preferred embodiment in accordance to this invention, wherein like parts are indicated by like or similar reference numerals as used in FIG. 16A, so that a repeated explanation is omitted here. In FIG. 16B the 3D (i.e. quintic) structure is located between the first electrode layer 1603a and the first electric layer 1605. The second 3D (i.e. quintic) structure is shaped structures are formed, or etched from the top of the first electric layer 1605 which the second electric layer 1602 is deposed. The second electrode 1603a is then formed on top of the second electrical material 1602. This results in the pn junction being formed in the shape of the 3D structure. Wherein the trap or reflective structure is the same as described above in the description for FIG. 15A or others mentioned in FIGS. 2A to 14B.

According to this invention, in way of an example not way of limitation, alternatively the embodiments described in FIGS. 2A through 16B may also include a second or more p-n junctions. Such a junction may include the addition of a third electrical material layer of placed in contact with an electrical layer mentioned above, of opposite type than the electrical layer in contract with the third electrical material layer (not shown here). Alliteratively, two additional electrical layers can be added to the invention, above or below the place electrical layers that make the previously described p-n junction. This will add additional p-n junction for each electrical material that is in contact with an electrical material of different type (not shown here). For making a second or more p-n junction, more than one electrical material layer may necessary. Furthermore, according to this invention, more than one electrical material layers interfacing with the electrodes mention above may necessary to reduce the ohmic-contact resistance. Furthermore, according to this invention, more than one electrical conductive layers may be used for making the electrodes mentioned above. According to this invention, in way of an example not way of limitation, the electrical material or electric material is used for the sake of explanation, and those are the same meaning.

According to this invention, in way of an example not way of limitation, 3D structures described above can be selected from the group consisting of quintic shaped, quintic-shaped like, rods (wires), cone, pyramids, truncated quintic-shaped, truncated quintic shaped like, truncated cone, truncated pyramids, and combination thereof. The 3D structures for (example quintic structures) may have a gap or without a gap in between two 3D structures. Herein, the "Gap" is mentioned a physical distance of two 3D structures measuring from edge of one 3D structure base to other 3D structure, located close proximity or adjacent to each other. All type of 3D structures mentioned above and/or as shown in FIGS. 2A to 16B has the space or void in between the nearest neighbors of two similar or dissimilar 3D structures. Here "Space" or "Void" is the opening area in between two 3D structures located adjacent or close proximity to each other. These spaces or voids are always present irrespective of 3D structures are having with gaps or with gaps. These 3D structures (i.e. Quintic structures or other 3D structure) may have be arranged in one dimensional or 2-dimensional array, or combination thereof (not shown here). The array of one dimensional or 2 dimensional can be made by using any of 3D structures mentioned above or combination of thereof (not shown here)

According to this invention, in way of an example not way of limitation, the passivation layer in the embodiments described in FIGS. 2A through 16B may be insulating material and/or electrical material. In way of an example not way of limitation, the passivation layer used for one or more of the following purposes, including but not limited to: (a) to insulate, (b) to reduce the leakage current, (c) to make the semiconductor junction, and/or (d) to reduce the ohmic contact resistance.

According to this invention, in way of an example not way of limitation, alternatively the embodiments described in FIGS. 2A through 16B may also include a radiation hardness layer, top, or bottom or both sides, or surrounding the cells preventing from performance degradation due to high energy particle (not shown here).

According to this invention, in way of an example not way of limitation, the electrical materials mentioned in FIGS. 2A to 16B, forming the p-n junction or Schottky junction are semiconductor materials which may consist of semiconductors such as Si, Ge, GaAs, GaN, InP, GaP, GaSb, CGIS, CdTe, Zn CdTe, or ZnO or polymer or metal or a combination of thereof. The substrate mentioned in FIGS. 2A to 16B can be chosen from a group consisting of semiconductor, dielectric, insulator, semi-insulator, electrical conductive, metal, polymer, or combination thereof.

According to this invention, in way of an example not way of limitation, the quintic structure could be II-V based materials (n or p type), for example CdTe, and the dozens of the materials could be II-VI based material like CdZnS (p or n type, opposite to CdTe rods) or Zn(Cd)Te/ZnS based materials formed on the substrate. In this case, by adjusting the Zn contents, the band gap can be tuned and thereby a wide spectrum of solar energy can be absorbed.

According to this invention, in way of an example not way of limitation, alternatively the quintic structures or rods could be Si or amorphous Silicon materials (n or p type) and the electrical materials could be Si:Ge alloy (p or n type, opposite to Si quintic structure). In this case, by adjusting the Ge contents, the band gap can be tuned and thereby a wide spectrum of solar energy can be absorbed.

According to this invention, in way of an example not way of limitation, alternatively the rods or quintic structure, or quintic-shaped like (i.e 3D structure) could be Si, InP, or CdTe (n or p type) and various semiconductor materials could make the junction with the rods or quintic structure, or quintic-shaped like (wires or tubes or 3D structures) and each type of material would have a specific band gap for absorbing a specific range of the solar spectrum. In this way a wide range of the solar spectrum can be absorbed, and by increasing the junction area (due to use of the rods, wires, or tubes), the electrical power generation could be increased tremendously (50 times and beyond).

According to this invention, in way of an example not way of limitation, the nanometer(s)-scale wires, rods, tubes, pyramid, cone, trapezoidal, or quintic structures mentioned in the preferred embodiments, can be made from any kind of electronic materials, semiconductor, insulator, or metal or the combination of thereof.

According to this invention, in way of an example not way of limitation, the nanometer sized rods, wires or tubes can be made from semiconductors such as Si, Ge, or compound semiconductors from III-V or II-VI groups. As an example, for rods, wires, or tubes, InP, GaAs, GaP, Pbs, or GaN III-V compound semiconductors can be used and they can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, GaSb, InSb, InAs, CdTe, CdS, ZnCdTe, HgCdTe, PbSe, PbS, ZnSe, ZnS, etc. The substrate can also cover all kinds of polymers or ceramics such as AN, Silicon-oxide, etc.

According to this invention, in way of an example not way of limitation, the nanometer sized rods, wires, or tubes based on an II-VI compound semiconductor can also be used. As an example, CdTe, CdS, Cdse, ZnS, HgCdTe, HgZnTe, PbSe, PbS, or ZnSe can be used, and they can be made using standard growth processes, for example, sputtering, evaporation, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaP, GaN, ZnS, CdTe, CdS, ZnCdTe, HgCdTe, HgZnTe, GaSb, etc. The substrate can also cover all kinds of polymers, ceramics such as AN, Silicon-oxide, or metal etc.

According to this invention, in way of an example not way of limitation, the rods, wire, or tubes, mentioned earlier to make the photovoltaic cell, can be micro or nano scaled and their sides could be vertical or inclined (in shape) at an angle (e.g α) with respect to the surface of substrate. Alternatively, the side could be nay shape convenient to manufacturing and increase the surface area. The advantage of using the inclined side is to concentrate the incident light falling onto the side and the gap in between the rods, wires, or tubes.

According to this invention, in way of an example not way of limitation, the nanometer sized rods, wires or tubes can be made from carbon type materials (semiconductors, insulators, or metal like performances), such as carbon nano-tubes, which could be single or multiple layered. They can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AN, Silicon-oxide, etc.

In the preferred embodiment and also in an exemplary embodiment of the invention, in way of an example not way of limitation, in FIGS. 2A to 16B, the thinned material (i.e. silicon) is considered to show the benefits of the structures to achieve reduced reflection loss in broad spectrum ranges, to make broadening the absorption and also to reduce transmission loss, even using of thinned material for potentially useful for the optical devices (i.e. photovoltaic cell). Furthermore, the radiation considered in the examples as shown in FIGS. 2A to 16B, are solar spectrum. Using of infrared (or UV) range material, the structure can also be used for reducing the reflection loss in desired broad spectrum ranges to enhance the optical performance of the device. According to this invention, with proper selection of material, its refractive index, and its physical parameters, the quintic structure (micro-nano scaled) can also be used as a broadband antireflection coating as an additional layer, structure itself as a part of the device, or combination thereof, in an optical device (i.e. photovoltaic cell, detector, photoconductive device) or use itself as the coating structure for the applications (not shown here) where reflection loss of radiation is to be minimized.

In the preferred embodiment and also in an exemplary embodiment of the invention, in way of an example not way of limitation, the square shape base is explained. This invention also covers all shapes of bases covering circular, elliptical, parabolic, or rectangular for the quintic structure and/or also quintic like structures. These structures can be arranged in periodically in array or randomly aligned. Furthermore, these structures can be arranged all in same heights or arranged in variable heights. Alternatively, each of the structure can be arranged side by side without gap, and/or each structure can be arranged with a gap which could be fixed or variable In the preferred embodiment explained in FIGS. 10A to 16B, in way of an example not way of limitation, the quintic structure is considered as an 3D structure, for showing a benefit of the structure. All other structures such as quintic-like structures (semi-quintic structure) comprising of pyramid, cone, trapezoidal pyramid, quintic, or combination thereof, can be used for achieving the benefits.

According to this invention, alternatively with proper optimizing the structure, the structure can also be used as the high reflective coating layer (not shown here) usable in reflecting light in the device (laser device or in the detector or photovoltaic cell to reflect light.

Those skilled in the art will appreciate that the 3D structure such as pillar, cone, pyramid, trapezoidal, truncated pyramid, quintic, or truncated quintic shaped structure as shown in FIGS. 2A to 16B can be arranged with the square base 202 shown in FIG. 2A.—However, the square base may be replaced by any base shape such as elliptic, ellipsoidal, circular, triangular, elliptical, oval, or rectangular, or square, or pentagonal, or hexagonal or combination thereof, and arranged in array periodically or randomly, with or without any heights or bases, with or without gaps between 3D structures without deviating from the principles of the invention. Advantageously, the geometrical parameters of the any shapes (lengths of the major and minor axes) may be additionally selected to further control the proportion of the refractive indexes gradient passing through the air and through the material of the structures surrounding the structures and the base shape mentioned above. In this case also, the effective refractive indexes of 3D structure considering the base and 3D structure dimensions (i.e. height, base, etc.) Can be smoothly controlled to achieve enhanced performances (i.e. absorption). This adds many features in the optical devices such as enhanced conversion efficiency for PV cell, higher quantum efficiency in detector (which is function of absorption for given thickness of material used). Additionally, it may not necessary to face the device directed to the radiation in some aspect to achieve, appreciable performance. Furthermore, the structure is suitable for radiation, illuminated perpendicular, or some specific angle with respect to surface, or omni-directed illuminated on the structure, and yet to achieve similar performance.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

Although the invention has been described with respect to specific embodiments for complete and clear disclosure, the appended claims are not to be thus limited but are to be construed as embodying all modification and alternative constructions that may occur to one skilled in the art which fairly fall within the basic teaching here is set forth.

The present invention is expected to be found practically useful in that the novel photo-voltaic cells have higher power generation capability (25 times and beyond) when compared with that of the PV cells. The proposed invention can be used for fabricating solar modules for both commercial and space applications.

What is claimed is:

1. A photovoltaic cell comprising:
a substrate having a top surface,
wherein said top surface of the substrate has a three-dimensional geometric pattern etched from the substrate or formed on the substrate,
wherein the three-dimensional geometric pattern comprising an array of quintic, or quintic-like, or truncated quintic, or truncated quintic-like, or the combination thereof, shaped nano-scaled or micrometer-scaled protruding structures;
an absorption layer comprising at least one pn-junction,
wherein the at least one pn-junction comprises at least one first electrical material of p or n type, and at least one second electrical material of opposite type to the at least one first electrical material,
wherein said at least one first electrical material is conformally overlaying the protruding structures;
a pair of electrodes for a front electrode and a back electrode,
wherein the pair of electrodes electrically connects to the at least one pn-junction; and
an antireflective layer,
wherein the substrate is being a single piece of material,
wherein the nearest neighbors of two protruding structures from the array of protruding structures has a void or space created in between, and
wherein a passivation material fills the void or space between the nearest neighbors of the two protruding structures.

2. The photovoltaic cell of claim 1, wherein the protruding structures has a base, selected from a group consisting of elliptical, parabolic, rectangular, triangular, circular, trapezoidal, hexagonal, elliptical, and a combination thereof.

3. The photovoltaic cell of claim 1, wherein the protruding structures are arranged in a 2-dimensional array or in a 1-dimensional array.

4. The photovoltaic cell of claim 1, wherein the antireflective layer overlays the front electrode.

5. The photovoltaic cell of claim 1, further comprising a layer to hold the substrate.

6. The photovoltaic cell of claim 1, further comprising a reflection layer to reflect radiation back and forth until fully absorbed.

7. The photovoltaic cell of claim 4, wherein the height of each protruding structure is in between 580 nm to 1200 nm.

8. The photovoltaic cell of claim 1, wherein the protruding structures stand with an angle with respect to a base, of the protruding structures, wherein the angle is fixed or varied, and wherein the protruding structures are randomly or periodically aligned.

9. A photovoltaic cell comprising:
a substrate having a top surface,
wherein said top surface of the substrate has a three-dimensional geometric pattern etched from the substrate or formed on the substrate,
wherein the three-dimensional geometric pattern comprising an array of quintic, or quintic-like, or truncated quintic, or truncated quintic-like, or the combination thereof, shaped nano-scaled or micrometer-scaled protruding structures;
an absorption layer comprising at least one pn-junction,
wherein the at least one pn-junction comprises at least one first electrical material of p or n type, and at least one second electrical material of opposite type to the at least one first electrical material, wherein said at least one first electrical material is conformally overlaying the protruding structures;
a pair of electrodes for a front electrode and a back electrode,
wherein the pair of electrodes electrically connects to the at least one pn-junction;
at least one reflecting layer to reflect back and forth a radiation until fully absorbed; and
an antireflective layer,
wherein the substrate is being a single piece of material,
wherein the nearest neighbors of two protruding structures from the array of protruding structures has a void or space created in between, and
wherein a passivation material fills the void or space between the nearest neighbors of the two protruding structures.

10. The photovoltaic cell of claim 9, wherein the protruding structures has a base, selected from a group consisting of elliptical, parabolic, rectangular, triangular, circular, trapezoidal, hexagonal, elliptical, and a combination thereof.

11. The photovoltaic cell of claim 9, wherein the protruding structures has a gap between the structures, wherein the gaps are fixed or varied in a distance, and wherein the distances are randomly or periodically aligned.

12. The photovoltaic cell of claim 9, wherein the protruding structures has a height, wherein the height Is fixed, or varied, and wherein the protruding structures are random or periodically aligned.

13. The photovoltaic cell of claim 9, wherein the protruding structures stand with an angle with respect to a base of the protruding structures, wherein the angle is fixed or varied, and wherein the protruding structures are randomly or periodically aligned.

14. The photovoltaic cell of claim 9, wherein the protruding structures are arranged in a 2-dimensional array or in a 1-dimensional array.

15. A photovoltaic cell comprising:
a substrate having a top surface,
wherein said top surface of the substrate has a three-dimensional geometric pattern etched from the substrate or formed on the substrate,
wherein the three-dimensional geometric pattern comprising an array of quintic, or quintic-like, or truncated quintic, or truncated quintic-like, or the combination thereof, shaped nano-scaled or micrometer-scaled protruding structures;
an absorption layer comprising at least one pn-junction,
wherein the at least one pn-junction comprises at least one first electrical material of p or n type, and at least one second electrical material of opposite type to the at least one first electrical material, wherein said at least one first electrical material is conformally overlaying the protruding structures;
a pair of electrodes for a front electrode and a back electrode,
wherein the pair of electrodes electrically connects to the at least one pn-junction;
at least one reflecting layer to reflect back and forth a radiation until fully absorbed; and
an antireflective layer,
wherein the antireflective layer overlays the front electrode,
wherein the substrate is being a single piece of material,
wherein the nearest neighbors of two protruding structures from the array of protruding structures has a void or space created in between, and
wherein a passivation material fills the void or space between the nearest neighbors of the two protruding structures.

16. The photovoltaic cell of claim 15, wherein the protruding structures has a gap between the structures, wherein the gaps are fixed or varied in a distance, and wherein the distances are randomly or periodically aligned.

17. The photovoltaic cell of claim 15, wherein the protruding structures has a height, wherein the height Is fixed, or varied, and wherein the protruding structures are random or periodically aligned.

18. The photovoltaic cell of claim 15, wherein the protruding structures stand with an angle with respect to a base of the protruding structures, wherein the angle is fixed or varied, and wherein the protruding structures are random or periodically aligned.

19. The photovoltaic cell of claim 15, wherein the protruding structures are arranged in a 2-dimensional array or a 1-dimensional array.

* * * * *